(12) United States Patent
John Wilson et al.

(10) Patent No.: US 10,917,195 B2
(45) Date of Patent: Feb. 9, 2021

(54) CONTROL CHANNEL MOTHER CODE DETERMINATION FOR MULTI-TRANSMISSION CONFIGURATION INDICATION COMMUNICATION

(71) Applicant: QUALCOMM Incorporated, San Diego, CA (US)

(72) Inventors: Makesh Pravin John Wilson, San Diego, CA (US); Gabi Sarkis, San Diego, CA (US); Tao Luo, San Diego, CA (US); Kiran Venugopal, Raritan, NJ (US); Tianyang Bai, Bridgewater, NJ (US); Xiaoxia Zhang, San Diego, CA (US); Juan Montojo, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/415,641

(22) Filed: May 17, 2019

(65) Prior Publication Data
US 2019/0356420 A1    Nov. 21, 2019

Related U.S. Application Data

(60) Provisional application No. 62/674,428, filed on May 21, 2018.

(51) Int. Cl.
*H04L 1/00* (2006.01)
*H03M 13/29* (2006.01)

(52) U.S. Cl.
CPC ...... *H04L 1/0072* (2013.01); *H03M 13/2906* (2013.01); *H04L 1/0041* (2013.01);
(Continued)

(58) Field of Classification Search
CPC ... H04L 1/0041; H04L 1/0045; H04L 1/0057; H04L 1/0064; H04L 1/0068;
(Continued)

(56) References Cited

U.S. PATENT DOCUMENTS

| 2019/0149176 A1* | 5/2019 | Hui | H03M 13/13 |
| | | | 714/790 |
| 2019/0215720 A1* | 7/2019 | Li | H04W 28/06 |

(Continued)

OTHER PUBLICATIONS

Huawei et al., "Multi-Beam Transmission for Robustness", 3GPP TSG RAN WG 1 Meeting #89, 3GPP Draft; R1-1708136, 3rd Generation Partnership Project (3GPP), Mobile Competence Centre, 650, Route Des Lucioles ; F-06921 Sophia-Antipolis Cedex, France, vol. RAN WG1, No. Hangzhou; China, May 15, 2017-May 19, 2017, May 14, 2017 (May 14, 2017), pp. 1-5, XP051273332, Retrieved from the Internet: URL: http://www.3gpp.org/ftp/Meetings_3GPP_SYNC/RAN1/Docs/ [retrieved on May 14, 2017], Section 2, figures 2,3, Section 2.2.

(Continued)

*Primary Examiner* — Shelly A Chase
(74) *Attorney, Agent, or Firm* — Holland & Hart LLP

(57) ABSTRACT

Methods, systems, and devices for wireless communications are described. An encoder may utilize a common mother code for encoding control information to each set of control channel resources of a control channel, control channel associated with multiple transmission configuration indication (TCI) states. For example, the common mother code may include utilizing same parameters when constructing the polar code for each set of control channel resources, where the parameters include a block length, a number of (Continued)

information bits, or both. Additionally, rate matching procedures for each control channel resource may differ (e.g., puncturing, shortening, or repetition). Additionally or alternatively, the mother code and rate matching may be determined based on a sum of all available coded bits in each control channel resource and the number of information bits. A decoder may then attempt soft combination of candidates from the different sets of control channel resources to obtain decoded control information.

30 Claims, 19 Drawing Sheets

(52) U.S. Cl.
CPC .......... *H04L 1/0045* (2013.01); *H04L 1/0057* (2013.01); *H04L 1/0068* (2013.01)

(58) Field of Classification Search
CPC . H04L 1/0072; H03M 13/2906; H03M 13/13; H03M 13/618; H03M 13/2957; H03M 13/6362; H03M 13/6356; H04B 7/0617; H04B 7/0408
See application file for complete search history.

(56) References Cited

U.S. PATENT DOCUMENTS

| | | | | |
|---|---|---|---|---|
| 2019/0238270 | A1* | 8/2019 | Pan | H04B 7/0695 |
| 2019/0393987 | A1* | 12/2019 | Hong | H04L 1/0057 |
| 2020/0177424 | A1* | 6/2020 | Noh | H04L 27/2607 |

OTHER PUBLICATIONS

Interdigital Inc: "Evaluation of PDCCH repetition for URLLC", 3GPP Draft; R1-1804853 Evaluation of PDCCH Repetition for URLLC, 3rd Generation Partnership Project (3GPP), Mobile Competence Centre, 650, Route Des Lucioles, F-06921 Sophia-Antipolis Cedex, France , vol. RAN WG1, No. Sanya, China; Apr. 16, 2018-Apr. 20, 2018, Apr. 15, 2018 (Apr. 15, 2018), XP051427116, 8 Pages, Retrieved from the Internet: URL:http://www.3gpp.org/ftp/Meetings%5F3GPP%5FSYNC/RAN1/Docs/ [retrieved on Apr. 15, 2018], Sections 2.3, 2.4, Appendix A, figure 2.

International Search Report and Written Opinion—PCT/US2019/033112—ISA/EPO—dated Aug. 27, 2019.

Samsung: "Multi-beam Transmission for NR-PDCCH", 3GPP Draft; R1-1707987 Multi-Beam Transmission for NR-PDCCH, 3rd Generation Partnership Project (3GPP), Mobile Competence Centre ; 650, Route Des Lucioles ; F-06921 Sophia-Antipolis Cedex; France, vol. RAN WG1, No. Hangzhou, China; May 15, 2017-May 19, 2017, May 14, 2017 (May 14, 2017), XP051273184, 7 Pages, Retrieved from the Internet: URL:http://www.3gpp.org/ftp/Meetings_3GPP_SYNC/RAN1/Docs/ [retrieved on May 14, 2017], figure 3, Section 2.3.

Samsung: "Remaining Issues on NR Polar Coding", 3GPP Draft; R1-1801992 Remaining Issues on Polar Coding R1, 3rd Generation Partnership Project (3GPP), Mobile Competence Centre ; 650, Route Des Lucioles ; F-06921 Sophia-Antipolis Cedex; France, vol. RAN WG1, No. Athens, Greece; Feb. 26, 2018-Mar. 2, 2018, Feb. 17, 2018 (Feb. 17, 2018), XP051397787, 7 Pages, Retrieved from the Internet: URL:http://www.3gpp.org/ftp/tsg%5Fran/WG1%/05FRL1/TSGR1%5F92/Docs/ [retrieved on Feb. 17, 2018].

\* cited by examiner

CONTROL CHANNEL MOTHER CODE DETERMINATION FOR MULTI-TRANSMISSION CONFIGURATION INDICATION COMMUNICATION

CROSS REFERENCES

The present Application for patent claims the benefit of U.S. Provisional Patent Application No. 62/674,428 by JOHN WILSON, et al., entitled "CONTROL CHANNEL MOTHER CODE DETERMINATION FOR MULTI-TRANSMISSION CONFIGURATION INDICATION COMMUNICATION," filed May 21, 2018, assigned to the assignee hereof, and expressly incorporated herein.

BACKGROUND

The following relates generally to wireless communications, and more specifically to control channel mother code determination for multi-transmission configuration indication (TCI) communication.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM). A wireless multiple-access communications system may include a number of base stations or network access nodes, each simultaneously supporting communication for multiple communication devices, which may be otherwise known as user equipment (UE).

Some wireless communications systems (e.g., systems supporting millimeter wave (mmW) communications) may use beamforming in order to overcome the relatively high path losses associated with high carrier frequencies in these systems. Accordingly, one or both of a base station and a UE may utilize beamformed transmissions when communicating, including utilizing the beamformed transmission of control channels. Additionally, a single control channel may be associated with multiple TCI states. A control channel may be transmitted over multiple TCI states, including on multiple transmit beams. In some cases, the amount of resources (e.g., the number of resource elements) available for control channel transmissions may also differ per TCI state, introducing complications for encoding and decoding of control channel transmissions. As such, improved encoding and decoding techniques are desired which may enable more efficient control channel transmissions associated with multiple TCI states.

SUMMARY

The described techniques relate to improved methods, systems, devices, and apparatuses that support the determination of a control channel mother code for multi-transmission configuration indication (TCI) communication. Generally, the described techniques provide for an encoder which may utilize a common mother code for initially encoding control information for one or more sets of control channel resources of a control channel, where each set of control channel resources may be associated with a TCI state, and each TCI may be associated with a different beam and a different number of resource elements for each control channel. For example, the common mother code may include utilizing same parameters when constructing the polar code for each set of control channel resources, where the parameters include at least a blockcode length (N) (hereinafter also referred to as a code length N or length N) and a number of information bits (K). Additionally, rate matching procedures may differ for each set of control channel resources (e.g., puncturing, shortening, or repetition, or different amounts of puncturing, shortening, or repetition). Additionally or alternatively, the described techniques may include determining the mother code and rate matching based on a sum of all available coded bits across the sets of control channel resources and the number of information bits. A decoder may perform a soft combine of codewords received according to the multiple TCI states on the sets of control channel resources to obtain the control information.

A method of wireless communication is described. The method may include identifying control information bits to be transmitted using a first transmit beam on a first set of resources of a control channel and to be transmitted using a second transmit beam on a second set of resources of the control channel, the second set of resources having a different number of resources than the first set of resources, determining parameter values for a polar code based on the first set of resources and the second set of resources, at least one of the parameter values common to the polar code for the first set of resources and the second set of resources, encoding the control information bits using the polar code having the determined parameter values to generate a codeword, rating matching the codeword to the first set of resources and the second set of resources, and transmitting the rate matched codeword on the first set of resources using the first transmit beam and the second set of resources using the second transmit beam.

An apparatus for wireless communication is described. The apparatus may include a processor, memory in electronic communication with the processor, and instructions stored in the memory. The instructions may be executable by the processor to cause the apparatus to identify control information bits to be transmitted using a first transmit beam on a first set of resources of a control channel and to be transmitted using a second transmit beam on a second set of resources of the control channel, the second set of resources having a different number of resources than the first set of resources, determine parameter values for a polar code based on the first set of resources and the second set of resources, at least one of the parameter values common to the polar code for the first set of resources and the second set of resources, encode the control information bits using the polar code having the determined parameter values to generate a codeword, rate matching the codeword to the first set of resources and the second set of resources, and transmit the rate matched codeword on the first set of resources using the first transmit beam and the second set of resources using the second transmit beam.

Another apparatus for wireless communication is described. The apparatus may include means for identifying control information bits to be transmitted using a first transmit beam on a first set of resources of a control channel and to be transmitted using a second transmit beam on a second set of resources of the control channel, the second set of resources having a different number of resources than the first set of resources, determining parameter values for a polar code based on the first set of resources and the second set of resources, at least one of the parameter values common to the polar code for the first set of resources and the second set of resources, encoding the control information bits using the polar code having the determined parameter values to generate a codeword, rating matching the codeword to the first set of resources and the second set of resources, and transmitting the rate matched codeword on the first set of resources using the first transmit beam and the second set of resources using the second transmit beam.

A non-transitory computer-readable medium storing code for wireless communication is described. The code may include instructions executable by a processor to identify control information bits to be transmitted using a first transmit beam on a first set of resources of a control channel and to be transmitted using a second transmit beam on a second set of resources of the control channel, the second set of resources having a different number of resources than the first set of resources, determine parameter values for a polar code based on the first set of resources and the second set of resources, at least one of the parameter values common to the polar code for the first set of resources and the second set of resources, encode the control information bits using the polar code having the determined parameter values to generate a codeword, rate matching the codeword to the first set of resources and the second set of resources, and transmit the rate matched codeword on the first set of resources using the first transmit beam and the second set of resources using the second transmit beam.

In some examples of the method, apparatuses, and non-transitory computer-readable medium described herein, the at least one of the parameter values common to the polar code may include a number of information bits of the polar code, or a block code length of the polar code, or a combination thereof.

Some examples of the method, apparatuses, and non-transitory computer-readable medium described herein for determining the parameter values for the polar code may further include operations, features, means, or instructions for identifying a first number of available coded bits for the first set of resources, identifying a second number of available coded bits for the second set of resources and determining the parameter values for the polar code based on the first number of available coded bits, or the second number of available coded bits, or a combination thereof, and the first set of resources and the second set of resources.

In some examples of the method, apparatuses, and non-transitory computer-readable medium described herein, determining the parameter values for the polar code may include operations, features, means, or instructions for identifying a rule used to determine the parameter values for the polar code and determining the parameter values for the polar code based on the identified rule, the first set of resources, and the second set of resources.

Some examples of the method, apparatuses, and non-transitory computer-readable medium described herein may further include operations, features, means, or instructions for communicating (e.g., receiving or transmitting, etc.) an indication of the rule, where the rule may be identified based on the communicated (e.g., received or transmitted) indication.

In some examples of the method, apparatuses, and non-transitory computer-readable medium described herein, communicating the indication of the rule may include operations, features, means, or instructions for communicating (e.g., receiving or transmitting) the indication of the rule in radio resource control (RRC) signaling, or a downlink control information (DCI), or a medium access control (MAC) control element (CE).

In some examples of the method, apparatuses, and non-transitory computer-readable medium described herein, rate matching the codeword to the first set of resources and the second set of resources may include operations, features, means, or instructions for rate matching the codeword to the first set of resources using a first rate matching procedure and rate matching the codeword to the second set of resources using a second rate matching procedure different from the first rate matching procedure.

In some examples of the method, apparatuses, and non-transitory computer-readable medium described herein, the first rate matching procedure may include puncturing, or shortening, or repetition, or a combination thereof, the second rate matching procedure may include puncturing, or shortening, or repetition, or a combination thereof, and the second rate matching procedure may be different than the first rate matching procedure.

In some examples of the method, apparatuses, and non-transitory computer-readable medium described herein, rate matching the codeword to the first set of resources and the second set of resources may include operations, features, means, or instructions for rate matching the codeword to a combination of the first set of resources and the second set of resources.

In some examples of the method, apparatuses, and non-transitory computer-readable medium described herein, the control channel may include an uplink control channel and the control information bits correspond to uplink control information.

In some examples of the method, apparatuses, and non-transitory computer-readable medium described herein, the control channel may include a downlink control channel and the control information bits correspond to downlink control information.

In some examples of the method, apparatuses, and non-transitory computer-readable medium described herein, a first input vector of the polar code for the first set of resources may include one or more frozen bits with a same location in a second input vector of the polar code for the second set of resources.

In some examples of the method, apparatuses, and non-transitory computer-readable medium described herein, a first input vector of the polar code for the first set of resources may include one or more parity check bits with a same location in a second input vector of the polar code for the second set of resources.

In some examples of the method, apparatuses, and non-transitory computer-readable medium described herein, the same location in the first input vector and the second input vector may include a lowest weight row of a generator matrix for the polar code.

In some examples of the method, apparatuses, and non-transitory computer-readable medium described herein, determining the parameter values for the polar code may include operations, features, means, or instructions for identifying a total number of resources across the first set of resources and the second set of resources and determining the parameter values for the polar code based on the identified total number of resources.

Some examples of the method, apparatuses, and non-transitory computer-readable medium described herein may further include operations, features, means, or instructions for identifying one of the first set of resources or the second set of resources as having a higher value of a channel characteristic and mapping higher reliability bits of the control information bits to the one of the first set of resources or the second set of resources having the higher value of the channel characteristic.

In some examples of the method, apparatuses, and non-transitory computer-readable medium described herein, the channel characteristic may include a signal-to-noise ratio (SNR), or a signal-to-interference-plus-noise ratio (SINR), or a signal strength, or a signal quality, or a combination thereof.

Some examples of the method, apparatuses, and non-transitory computer-readable medium described herein may further include operations, features, means, or instructions for identifying values of the channel characteristic for the first set of resources of the control channel, or the second set of resources of the control channel, or a combination thereof, based on quasi-co-location information.

Some examples of the method, apparatuses, and non-transitory computer-readable medium described herein may further include operations, features, means, or instructions for identifying that a first codeblock for the control channel may have a lower priority than a second codeblock to be mapped to the second set of resources for the control channel and mapping the first codeblock to a subset of the first set of resources based on the lower priority.

In some examples of the method, apparatuses, and non-transitory computer-readable medium described herein, the at least one of the parameter values common to the polar code for the first set of resources and the second set of resources may be associated with a first parameter for the polar code, and a first parameter value for a second parameter for the polar code for the first set of resources may be different than a second parameter value for the second parameter for the second set of resources.

A method of wireless communication is described. The method may include receiving a first codeword on a first set of resources of a control channel using a first receive beam and a second codeword on a second set of resources of the control channel using a second receive beam, the second set of resources having a different number of resources than the first set of resources, where the first codeword and the second codeword correspond to control information bits encoded using a polar code having at least one parameter value common to the polar code for the first set of resources and the second set of resources, decoding the first codeword and the second codeword according to the polar code and a rate matching procedure, and obtaining the control information bits based on the decoded first codeword and the decoded second codeword.

An apparatus for wireless communication is described. The apparatus may include a processor, memory in electronic communication with the processor, and instructions stored in the memory. The instructions may be executable by the processor to cause the apparatus to receive a first codeword on a first set of resources of a control channel using a first receive beam and a second codeword on a second set of resources of the control channel using a second receive beam, the second set of resources having a different number of resources than the first set of resources, where the first codeword and the second codeword correspond to control information bits encoded using a polar code having at least one parameter value common to the polar code for the first set of resources and the second set of resources, decode the first codeword and the second codeword according to the polar code and a rate matching procedure, and obtain the control information bits based on the decoded first codeword and the decoded second codeword.

Another apparatus for wireless communication is described. The apparatus may include means for receiving a first codeword on a first set of resources of a control channel using a first receive beam and a second codeword on a second set of resources of the control channel using a second receive beam, the second set of resources having a different number of resources than the first set of resources, where the first codeword and the second codeword correspond to control information bits encoded using a polar code having at least one parameter value common to the polar code for the first set of resources and the second set of resources, decoding the first codeword and the second codeword according to the polar code and a rate matching procedure, and obtaining the control information bits based on the decoded first codeword and the decoded second codeword.

A non-transitory computer-readable medium storing code for wireless communication is described. The code may include instructions executable by a processor to receive a first codeword on a first set of resources of a control channel using a first receive beam and a second codeword on a second set of resources of the control channel using a second receive beam, the second set of resources having a different number of resources than the first set of resources, where the first codeword and the second codeword correspond to control information bits encoded using a polar code having at least one parameter value common to the polar code for the first set of resources and the second set of resources, decode the first codeword and the second codeword according to the polar code and a rate matching procedure, and obtain the control information bits based on the decoded first codeword and the decoded second codeword.

Some examples of the method, apparatuses, and non-transitory computer-readable medium described herein may further include operations, features, means, or instructions for performing soft combining of the first codeword and the second codeword to obtain the control information bits.

In some examples of the method, apparatuses, and non-transitory computer-readable medium described herein, the at least one parameter value common to the polar code may include a number of information bits of the polar code, or a block code length of the polar code, or a combination thereof.

Some examples of the method, apparatuses, and non-transitory computer-readable medium described herein may further include operations, features, means, or instructions for identifying a first number of available coded bits for the first set of resources, identifying a second number of available coded bits for the second set of resources, and determining the at least one parameter value common to the polar code based on the first number of available coded bits, or the second number of available coded bits, or a combination thereof.

Some examples of the method, apparatuses, and non-transitory computer-readable medium described herein may further include operations, features, means, or instructions for identifying a rule used to determine the at least one parameter value common to the polar code and determining the at least one parameter value based on the identified rule, the first set of resources, and the second set of resources.

Some examples of the method, apparatuses, and non-transitory computer-readable medium described herein may further include operations, features, means, or instructions for communicating (e.g., transmitting, receiving, etc.) an indication of the rule to a UE, where the rule may be identified based on the received indication.

In some examples of the method, apparatuses, and non-transitory computer-readable medium described herein, communicating the indication may include operations, features, means, or instructions for communicating (e.g., transmitting, receiving, etc.) the indication in RRC signaling, or a DCI, or a MAC-CE.

In some examples of the method, apparatuses, and non-transitory computer-readable medium described herein, decoding the first codeword and the second codeword according to the polar code and a rate matching procedure may include operations, features, means, or instructions for decoding the first codeword according to the polar code and a first rate matching procedure and decoding the second codeword according to the polar code and a second rate matching procedure, the second rate matching procedure different from the first rate matching procedure.

In some examples of the method, apparatuses, and non-transitory computer-readable medium described herein, decoding the first codeword and the second codeword according to the polar code and a rate matching procedure may include operations, features, means, or instructions for decoding the first codeword and the second codeword according to the polar code and the rate matching procedure for a combination of the first set of resources and the second set of resources.

In some examples of the method, apparatuses, and non-transitory computer-readable medium described herein, the control channel may include an uplink control channel and the control information bits correspond to uplink control information.

In some examples of the method, apparatuses, and non-transitory computer-readable medium described herein, the control channel may include a downlink control channel and the control information bits correspond to downlink control information.

Some examples of the method, apparatuses, and non-transitory computer-readable medium described herein may further include operations, features, means, or instructions for identifying a total number of resources across the first set of resources and the second set of resources and determining the at least one parameter value common to the polar code based on the identified total number of resources.

DETAILED DESCRIPTION

Figure 1:
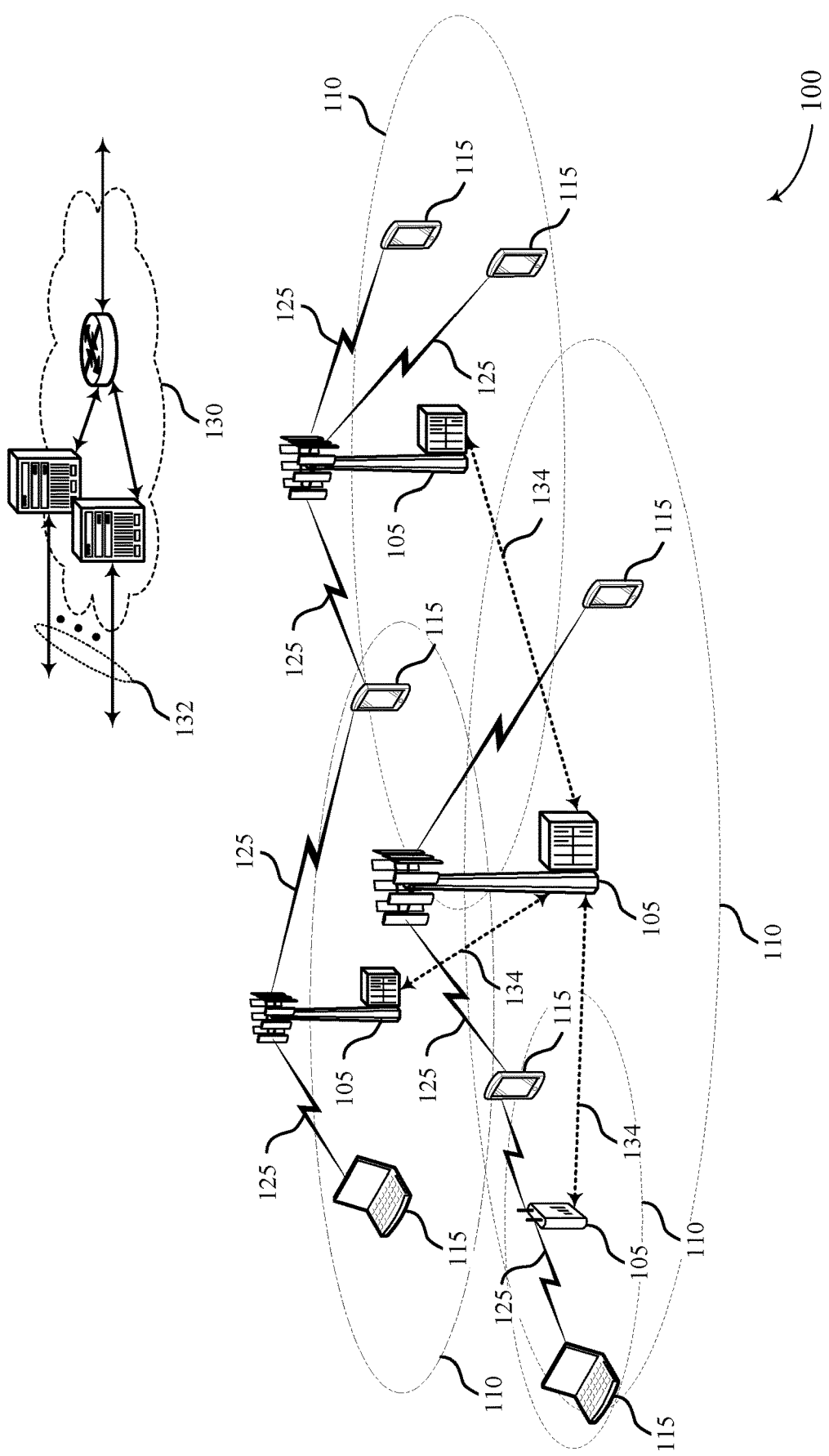
FIG. 1 illustrates an example of a system for wireless communications that supports control channel mother code determination for multi-transmission configuration indication (TCI) communication in accordance with aspects of the present disclosure.

The described techniques relate to improved methods, systems, devices, or apparatuses that support a combining of control channel resources in multi-transmission configuration indication (TCI) communications based on a common mother code for the control channel resources, e.g., sets of control channel resources for a single control channel. Wireless communications systems may use beamforming in order to overcome relatively high path losses associated with high carrier frequencies in these systems. Accordingly, one or both of a base station and a UE may utilize beamformed transmissions when communicating. In some cases, the base station and the UE may transmit a control channel and associated control information across multiple beams to enhance robustness and reliability. In some cases, the base station and/or the UE may transmit the control channel and associated control information according to separate TCI states (e.g., different TCI states) across multiple control channel resources on multiple beams, where the control channel resources corresponding to the different TCI states may be different in size. The same control information may be encoded at a transmitting wireless device and transmitted on multiple beams according to the different TCI states. However, coding schemes may differ for different TCI states, affecting the ability of a decoding device to combine the different control channel resources across the multiple TCI states. Additionally, each TCI state may include a different number of resource elements for the corresponding control channel resource. As such, when applying a coding scheme (e.g., polar coding) to the control channel resources, each resource may be coded differently based on the number of resource elements available according to the respective TCI state for each resource, which may affect the ability of a decoder to combine multiple control channel resources for properly decoding an encoded control channel (e.g., the encoded control information).

In order to enable the decoder to efficiently combine the encoded control channel resources, an encoder (e.g., an encoding UE or base station) may use a same mother code (e.g., mother polar code) to encode control information (e.g., uplink control information (UCI) or downlink control information (DCI)) for each set of control channel resources associated with different TCI states (e.g., beams). For example, for polar coding, the common mother code may include utilizing one or more of the same parameters when constructing the polar code for each control channel resource (e.g., a number of information bits (K) and a polar code block length (N)). As such, the mother code may include an indication of a common starting code that each control channel utilizes for a corresponding coding scheme (e.g., polar code).

In some cases, the polar code block length (N) for the mother code may be determined based on a function dependent in part on the available coded bits in each control channel resource ($E_{r,i}$ for each control channel resource i). Additionally, since each control channel resource may have a different number of available coded bits, rate matching procedures may differ between control channel resources (e.g., different ones of puncturing, shortening, or repetition, or different amounts of puncturing, shortening, or repetition, etc.), where for each corresponding control channel resource, the rate matching procedure may be a function of the polar code block length (N) for the mother code and the number of available coded bits (e.g., a first set of resources associated with a first TCI state, a second set of resources associated with a second TCI state, etc.). Accordingly, an input sequence (u) may be the same across control channel resources, and the output sequence (e.g., output of the polar coding process) may be adjusted according to a corresponding rate matching procedure for each control channel resource or each set of control channel resources. As part of the input sequence being the same, the location of frozen bits and/or parity check bits for the mother polar code may be the same across control channel resources.

Additionally or alternatively, the techniques described herein may include determining the mother code based on a sum of all available coded bits in each control channel resource (e.g., $\Sigma_i E_{r,i}$) and the parameter values for the polar code (e.g., the number of information bits (K)). Accordingly, rate matching may be specified by a mapping of coded bits across the multiple control channel resources, and the mother polar code may be determined based on a sum of the coded bits across the control channel resources. In some cases, a signal-to-noise ratio (SNR) of each control channel resource may be used for determining the mapping of coded blocks to the control channel resources. For example, if a control channel resource has multiple code blocks (e.g., two (2)) and a different number of available coded bits ($E_{r,i}$) per code block, a first code block may be mapped to all of the available coded bits and additional code blocks (e.g., a second code block) may be mapped to subsets of the available coded bits. In some cases, the mapping of the code blocks and/or any addition or removal of code blocks may be based on a priority of the code blocks. As described herein, the techniques for the mother code determination may be applicable to both uplink and downlink control channels.

Aspects of the disclosure are initially described in the context of a wireless communications system. Additionally, aspects of the disclosure are then described and illustrated through another wireless communications system, a polar encoding procedure, a rate matching procedure, polar encoder message flows, and a process flow. Aspects of the disclosure are further illustrated by and described with reference to apparatus diagrams, system diagrams, and flowcharts that relate to control channel mother code determination for multi-TCI communication.

FIG. 1 illustrates an example of a wireless communications system 100 that supports control channel mother code determination for multi-TCI communication in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200$ $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-UTRA absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or DFT-s-OFDM).

The organizational structure of the carriers may be different for different radio access technologies (e.g., LTE, LTE-A, LTE-A Pro, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that may be associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that can support simultaneous communications via carriers associated with more than one different carrier bandwidth.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across the frequency domain) and horizontal (e.g., across the time domain) sharing of resources.

A base station 105 may insert periodic pilot symbols such as a cell-specific reference signal (CRS) to aid UEs 115 in channel estimation and coherent demodulation. CRS may include one of 504 different cell identities. They may be modulated using quadrature phase shift keying (QPSK) and power boosted (e.g., transmitted at 6 dB higher than the surrounding data elements) to make them resilient to noise and interference. CRS may be embedded in 4 to 16 resource elements in each resource block (RB) based on the number of antenna ports or layers (up to 4) of the receiving UEs 115. In addition to CRS, which may be utilized by all UEs 115 in the coverage area 110 of the base station 105, demodulation reference signal (DM-RS) may be directed toward specific UEs 115 and may be transmitted only on RBs assigned to those UEs 115. DM-RS may include signals on 6 resource elements in each RB in which they are transmitted. The DM-RS for different antenna ports may each utilize the same 6 resource elements, and may be distinguished using different orthogonal cover codes (e.g., masking each signal with a different combination of 1 or −1 in different resource elements). In some cases, two sets of DM-RS may be transmitted in adjoining resource elements. In some cases, additional reference signals known as channel state information reference signals (CSI-RS) may be included to aid in generating channel state information (CSI). On the uplink, a UE 115 may transmit a combination of periodic sounding reference signal (SRS) and uplink DM-RS for link adaptation and demodulation, respectively.

A UE 115 attempting to access a wireless network may perform an initial cell search by detecting a primary synchronization signal (PSS) from a base station 105. The PSS may enable synchronization of slot timing and may indicate a physical layer identity value. The UE 115 may then receive a secondary synchronization signal (SSS). The SSS may enable radio frame synchronization, and may provide a cell identity value, which may be combined with the physical layer identity value to identify the cell. The SSS may also enable detection of a duplexing mode and a cyclic prefix length. Some systems, such as time division duplexing (TDD) systems, may transmit an SSS but not a PSS. Both the PSS and the SSS may be located in the central 62 and 72 subcarriers of a carrier, respectively. After receiving the PSS and SSS, the UE 115 may receive a master information block (MIB), which may be transmitted in the physical broadcast channel (PBCH). The MIB may contain system bandwidth information, an SFN, and a physical hybrid automatic repeat request (HARD) indicator channel (PHICH) configuration. After decoding the MIB, the UE 115 may receive one or more Ms. For example, SIB1 may contain cell access parameters and scheduling information for other SIBs. Decoding SIB1 may enable the UE 115 to receive SIB2. SIB2 may contain RRC configuration information related to random access channel (RACH) procedures, paging, physical uplink control channel (PUCCH), physical uplink shared channel (PUSCH), power control, SRS, and cell barring. In some cases, a base station 105 may transmit synchronization signals (SSs) (e.g., PSS, SSS, and the like) using multiple beams in a beam-sweeping manner through a cell coverage area. For example, PSS, SSS, and/or broadcast information (e.g., a PBCH) may be transmitted within different synchronization signal (SS) blocks on respective directional beams, where one or more SS blocks may be included within an SS burst (SSB). In some cases, these SSs and RSs may be transmitted at different times and/or using different beams.

In some examples, base station 105 or UE 115 may be equipped with multiple antennas, which may be used to employ techniques such as transmit diversity, receive diversity, MIMO communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Different spatial layers may be associated with different antenna ports used for channel measurement and reporting. An antenna port is a logical entity used to map data streams to antennas. A given antenna port may drive transmissions from one or more antennas (e.g., and resolve signal components received over one or more antennas). Each antenna port may be associated with a reference signal (e.g., which may allow the receiver to distinguish data streams associated with the different antenna ports in a received transmission). In some cases, some antenna ports may be referred to as quasi co-located, meaning that the spatial parameters associated with a transmission on one antenna port may be inferred from the spatial parameters associated with another transmission on a different antenna port.

Accordingly, if a first set of antenna ports is quasi co-located with a second set of antenna ports, a UE 115 may be able to perform channel estimation for demodulating data or control information received on the first set of antenna ports based on reference signals received on the second set of antenna ports. For example, the UE 115 may be able to determine a delay spread, a Doppler shift, etc., associated with a downlink transmission of data or control information on the first set of antenna ports based on the reference signals received on the second set of antenna ports. The UE 115 may then use a channel estimate (i.e., determined based on performing channel estimation as described above) to correctly decode a downlink transmission from a base station 105. Thus, a quasi-colocation (QCL) relationship between antenna ports used for downlink communications between a base station 105 and a UE 115 may improve the chances that the UE 115 may be able to successfully decode a downlink transmission from the base station 105. As such, it may be appropriate for a base station to transmit, to a UE, an indication of which antenna ports are quasi co-located such that the UE may be able to identify additional reference signals to use for channel estimation.

In wireless communications system 100, a base station 105 may configure a set of TCI states that correspond to different QCL relationships between antenna ports used for communication with a UE 115. A TCI-state may be associated with a set of reference signals (e.g., synchronization signal blocks (SSBs) or different types of channel state information reference signals (CSI-RSs)), and the TCI state may indicate a QCL relationship between antenna ports used to transmit these reference signals and antenna ports used to transmit data or control information to a UE 115. As such, when a UE 115 receives an indication of a particular TCI state from a base station 105 (e.g., in downlink control information (DCI), RRC message, etc.), the UE 115 may identify that antenna ports used to transmit the reference signals associated with the TCI state are quasi co-located with antenna ports used to transmit data and control information to the UE 115. Thus, the UE 115 may use the reference signals associated with the TCI state to perform channel estimation for demodulating data or control information received from the base station 105. For example, the UE 115 may determine a delay spread, Doppler shift, etc., associated with a transmission of data or control information based on the reference signals associated with the TCI state.

Additionally, in some cases, a UE 115 and base station 105 may employ polar coding for data transmissions. A polar code may be composed of multiple channels having different levels of reliability. Channel reliability may represent a capacity of the channel to carry information as part of the encoded codeword. As indicated above, channels of a polar code having higher reliabilities may be used to encode information bits and the remaining channels may be used to encode frozen bits. A frozen bit is a bit having a known value to a decoder and may be, for example, set to a fixed bit value such as '0'. For a number of channels, a number of information bits may be loaded into the most reliable channels and a number of frozen bits (e.g., equal to the number of channels minus the number of information bits) may be loaded into the least reliable channels (e.g., according to the number of channels minus the number of information bits), where the number of information bits is less than the number of channels.

In some examples, a transmitter or encoder, such as a base station 105 or a UE 115, may identify a set of bit locations of a polar code for a set of information bits based on a transmission capacity factor determined according to a mapping between one or more of a mother polar code length for the codeword, a number of transmitted bits of an encoded codeword, and a first number of bits for the set of information bits. The set of bit locations may be determined based at least in part on a recursive partitioning of a set of bit-channels of the polar code for at least a subset of polarization stages of the polar code. For each partition of at least the subset of the polarization stages of the polar code, portions of the number of the information bits of each partition may be assigned to bit-channel sub-partitions that may be determined based at least in part on the mapping. The transmitter may encode a codeword according to the polar code based at least in part on the set of bit locations, rate match the codeword, and transmit the rate-matched and encoded codeword over the wireless channel. A receiver, such as a base station 105 or a UE 115, may receive the codeword over the wireless channel, identify bit locations of the polar code for a set of information bits, and decode the received codeword according to the polar code to obtain an information bit vector at the set of bit locations.

In some cases, individual control channel resources (sets of control channel resources) may be transmitted according to separate TCI states across one or more beams, where each control channel resource includes the control information for the same control channel which may enable a receiver to combine the control information in the control channel resources to correctly decode the complete control information, for example, in cases of interference experience by the control channel on one or more of the beams. Additionally, each TCI state may include a different number of resource elements for the corresponding control channel resource. As such, when applying a coding scheme (e.g., polar coding) to the control information for each set of control channel resources, each set of resources may be coded differently based on the number of resource elements available according to the respective TCI state for each resource, which may affect the ability of a decoder to combine codewords received on multiple different sets of control channel resources for properly decoding the encoded control channel.

Wireless communications system 100 may support efficient techniques for combining the encoded control channel resources. An encoder may utilize a common mother code for initially encoding the control information for a single control channel having multiple sets of control channel resources (e.g., separate sets of control channel resources, each having an associated TCI state). For example, for polar coding, the common mother code may include utilizing the same parameters (e.g., the number of information bits (K) and a polar code block length (N)) when constructing the polar code for each control channel resource. In some cases, the described techniques include determining the polar code block length (N) for the mother code based on a function of available coded bits in each control channel resource ($E_{r,i}$ for each control channel resource i, which may be a set of control channel resources associated with a TCI state). Additionally, since each control channel resource may have a different number of available coded bits, rate matching procedures may differ between control channel resources (e.g., puncturing, shortening, or repetition, or different amounts of puncturing, shortening, or repetition), where for each corresponding control channel resource, the rate matching procedure may be a function of the polar code block length (N) for the mother code and the number of available coded bits. Hereinafter, the term puncturing may also simply be referred to as block puncturing. Additionally or alternatively, the mother code may be determined based on a sum of all available coded bits in each control channel resource (e.g., $\Sigma_i E_{r,i}$) and the parameter values for the polar code (e.g., the number of information bits (K)). Accordingly, rate matching may be specified by a mapping of coded bits across the multiple control channel resources.

The subject matter described in this disclosure can be implemented to realize one or more potential advantages. One implementation may include an encoder identifying control information bits to be transmitted on more than one beam on different sets of resources corresponding to each beam and determining parameter values for a polar code based on the resources for each beam, where at least one of the parameter values is common for a polar code for the different sets of resources (e.g., a common mother polar code). The encoder may then encode the control information bits based on the determined parameter values to generate a codeword, rate match the codeword to the different sets of resources, and transmit the rate matched codeword on the different sets of resources using the corresponding beams. This implementation can be used for combining the different sets of resources based on a common mother polar code, reducing the complexity of determining individual coding parameter values for each set of resources separately. Additionally, this implementation may reduce the latency associated with encoding the different sets of resources through the utilization of the common mother polar code based on using at least one same parameter value regardless of the sets of resources. For example, a UE 115 (e.g., or another encoder) may transmit the control information bits and corresponding codewords faster by using the common mother polar code.

One example of an advantage of encoding the control information bits based on at least one same parameter value is that the encoder does not have to determine separate parameter values for the different sets of resources. For example, the at least one parameter value common to the polar code may include a number of information bits of the polar code, a block code length of the polar code, or a combination thereof. Conventionally, the encoder may determine these parameter values specific to each set of resources for encoding and transmitting control information bits on the corresponding sets of resources. However, using the at least one parameter value common to the polar code may reduce the need for determining the separate parameter values for determining the codeword, thereby reducing the time needed to encode the control information bits and transmit a corresponding codeword. For example, a processor in a UE 115 may encode the control information bits for transmission by the UE 115 (e.g., via a transmitter, transceiver, etc.) by using the at least one parameter value common to the mother code, reducing encoding time at the processor of the UE 115.

On the decoder side, the subject matter described in this disclosure can also be implemented to realize one or more additional potential advantages. For example, the decoder may receive, from the encoder, the codework on the different sets of resources, decode the codeword on each set of resources, and obtain the control information bits based on decoding the codeword. Accordingly, based on the at least one parameter value common to the polar code used to encode the codewords, the decoder may decode the codewords faster based on not having to determine or use separate parameter values for the decoding. Additionally, the decoder may perform a soft combining of multiple codewords received (e.g., on the different sets of resources) based on the at least one common parameter value to assist in decoding and receiving the control information bits. For example, if each set of resources used different parameter values, the decoder may be unable to combine codewords received on each set of resources to mitigate any interference that occurs when receiving the codewords and, as such, may not receive the full codeword correctly. Accordingly, by using the at least one common parameter value, the decoder may perform the soft combination to determine a full codeword where interference affects the codeword(s) and correctly obtain the control information bits. For example, a UE 115 (e.g., or another decoder) may decode the codeword(s) faster based on the at least one common parameter value, thereby reducing a latency between receiving the codeword(s) and obtaining the corresponding control information bits. Additionally, in some cases, a processor of the UE 115 may perform the soft combination of the multiple received codewords to enable the UE 115 to correctly obtain the control information bits.

Figure 2:
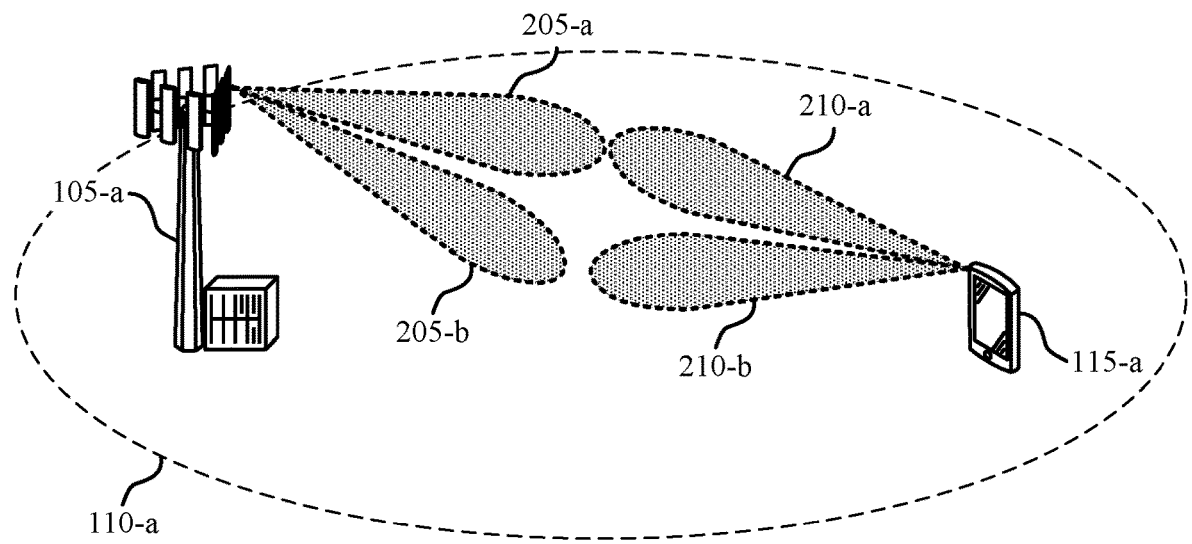
FIG. 2 illustrates an example of a wireless communications system that supports control channel mother code determination for multi-TCI communication in accordance with aspects of the present disclosure.

FIG. 2 illustrates an example of a wireless communications system 200 that supports control channel mother code determination for multi-TCI communication in accordance with aspects of the present disclosure. In some examples, wireless communications system 200 may implement aspects of wireless communications system 100. Wireless communications system 200 may include a base station 105-a and a UE 115-a, which may be examples of corresponding base stations 105 and UEs 115 as described above with reference to FIG. 1. Base station 105-a and UE 115-a may communicate utilizing beamformed transmissions over sets of beams, that include beams 205-a and 205-b (hereinafter also referred to as transmit beams 205-a and 205-b) and beams 210-a and 210-b (hereinafter also referred to as receive beams 210-a and 210-b). Additionally, in some cases, each set of beams may be associated with a separate TCI state. Where a control channel is transmitted using multiple TCI states, multiple sets of beams may each be associated with a separate control channel resource (e.g., a separate set of control channel resources), as described herein. For example, UE 115-a may transmit a PUCCH across transmit beams 210-a and 210-b, where transmit beam 210-a may be associated with a first TCI state and a first PUCCH resource and transmit beam 210-b may be associated with a second TCI state and a second PUCCH resource. Base station 105-a may receive signals via receive beams 205-a and 205-b, where receive beam 205-a may be associated with the first TCI state and the first PUCCH resource and receive beam 205-b may be associated with the second TCI state and the second PUCCH resource. A first set of beams may include transmit beam 210-a and receive beam 205-a, and a second set of beams may include transmit beam 210-b and receive beam 205-b. Three or more sets of beams respectively associated with three or more TCI states may be used.

In another example, base station 105-a may transmit a physical downlink channel (PDCCH) across transmit beams 205-a and 205-b, where transmit beam 205-a may be associated with the first TCI state and the first PDCCH resource and transmit beam 205-b may be associated with the second TCI state and the second PDCCH resource. UE 115-a may receive signals via receive beams 210-a and 210-b, where receive beam 210-a may be associated with the first TCI state and the first PDCCH resource and receive beam 210-b may be associated with the second TCI state and the second PDCCH resource.

In some cases, an encoder (e.g., UE 115-a and/or base station 105-b) may encode corresponding control information (e.g., uplink control information (UCI) and/or DCI) for a control channel (e.g., PUCCH or PDCCH, respectively) on respective beams (e.g., beams 205-a or 205-b and beams 210-a or 210-b) according to a polar coding scheme, as described herein. Accordingly, the encoder may transmit the same information for each resource of the control channel, where each set of control channel resources is associated with a separate TCI state. Since the number of resource elements available for a set of control channel resources may differ based on the TCI state (e.g., beam 210-a different from beam 210-b), the encoder may utilize a common mother code for initially encoding the information for each control channel resource (e.g., and/or each set of control channel resources). For example, for polar coding, the common mother code may include utilizing the same parameters (e.g., the number of information bits (K) and a polar code block length (N)) when constructing the polar code for each control channel resource. In some cases, the common mother code and/or parameters may be configured or signaled via radio resource control (RRC) signaling, DCI, medium access control (MAC) control element (MAC-CE), etc.

In some cases, the polar code block length (N) for the mother code may be determined based on a function of available resources, for example, the number of available coded bits in each control channel resource ($E_{r,i}$ for each control channel resource i). For example, the available resources for coded bits for a first set of control channel resources (e.g., $E_{r,0}$) may be 700 bits, and the available resources for coded bits for a second set of control channel resources (e.g., $E_{r,i}$) may be 500 bits. In the same example, N may be determined to be 512 bits based on $E_{r,0}$ and $E_{r,1}$ because it is a $2^N$ factor near the numbers of bits of the first and second set of control channel resources (e.g., between 500 and 700 bits) for polar coding. Additionally, since each control channel resource may have a different number of available coded bits, rate matching procedures may differ between control channel resources (e.g., puncturing, shortening, or repetition, or different amounts of puncturing, shortening, or repetition), where for each corresponding control channel resource, the rate matching procedure may be a function of the polar code block length (N) for the mother code and the number of available coded bits. For example, if E>N, the encoder may perform a repetition rate matching procedure. Alternatively, if E<N, the encoder may perform either a shortening or puncturing rate matching procedure.

As such, an input sequence (vector u) may be the same across control channel resources, and then the output sequence (e.g., output of the polar coding process) may be adjusted according to a corresponding rate matching procedure for each set of control channel resources. The polar code may be determined by the following equation (1):

$$x = G_N * u \qquad (1)$$

where $G_N$ denotes a G matrix (e.g., a polar code generator matrix) based on the number of information bits (K) and the polar code block length (N) for the mother code. As part of the input sequence being the same, the location of frozen bits and/or parity check bits for the mother polar code may be the same across control channel resources. For example, the frozen bits may be set on (e.g., assigned or allocated to) the least reliable channels of the polar code. In some cases, setting the locations of frozen bits according to the input sequence may be referred to as a pre-freezing step. Additionally, if the polar code includes parity check bits (e.g., depending on the size of the control information), the parity check bits may be the same in the input sequence (i.e., for the common mother code and each set of control channel resources). Accordingly, a rule may be defined across $E_{r,i}$ and K to determine if $n_{pc}^{wm}=1$, where $n_{pc}^{wm}$ denotes whether the polar code includes parity check bits (e.g., if $n_{pc}^{wm}=1$, then parity check bits are included, and if $n_{pc}^{wm}=0$, then parity check bits are not included). If parity check bits are included, $n_{pc}^{wm}=1$ may further denote the location of the parity check bits in the input sequence (u), where the location may be determined based on a lowest weight row of $G_N$ of the remaining unfrozen bits. In some cases, a common rule may be specified across multiple control channel resources.

Additionally or alternatively, the mother code may be determined based on a sum of all available coded bits in each control channel resource (e.g., $\Sigma_i E_{r,i}$) and the number of information bits (K). For example, as described above, the available resources for coded bits for a first control channel resource (e.g., $E_{r,0}$) may be 700 bits, and the available resources for coded bits for a first control channel resource (e.g., $E_{r,1}$) may be 500 bits. As such, the mother code may be based on N=1200 bits (e.g., $E_{r,0}+E_{r,1}=700+500=1200$ bits). Further, the rate matching for each control channel resource may be determined based on the sum of all available coded bits in each control channel resource. Accordingly, rate matching may be specified in mapping coded bits across the multiple control channel resources of the control channel (i.e., continue in a circular buffer, restart, or specify random variable (RV) locations). Additionally, a similar behavior may be specified for a Reed-Muller (RM) code for 3≤K≤11. In some cases, a signal-to-noise ratio (SNR) of each control channel resource may be used for determining the mapping of coded blocks to the control channel resources for the multiple sets of control channel resources. For example, the mapping may be performed such that bits having a relatively higher reliability are mapped to a control channel resource having a relatively larger SNR. In some cases, the SNR may be obtained from QCL information for each control channel resource. In other examples, measurements such as a signal-to-interference-plus-noise ratio (SINR), a signal strength (e.g., Reference Signal Received Power (RSRP)), or a signal quality (e.g., Reference Signal Received Quality (RSRQ)), or a combination of different measurements of the control channel may be used, for example to map the bits having a relatively higher or highest reliability to the set of control channel resources having the relatively highest value. Such measurements may be mapped such that the measurements are beam specific, for example, for the different sets of control channel resources.

If a control channel resource has multiple code blocks (e.g., two (2)) and a different number of available coded bits ($E_{r,i}$) per code block, a first code block may be mapped to all of the available coded bits and additional code blocks (e.g., second code block) may be mapped to subsets of the available coded bits. In some cases, the mapping of the code blocks and/or any addition/removal of code blocks may be based on a priority of the code blocks, the higher priority code blocks having greater redundancy by being mapped to a greater number of control channel resources.

As described herein, the techniques for the mother code determination may be applicable to both uplink and downlink control channels. For example, UE 115-a may encode UCI for a first PUCCH resource (e.g., a first set of control channel resources) and a second PUCCH resource (e.g., a second set of control channel resources) transmitted, respectively, on beams 210-a and 210-b. Accordingly, UE 115-a may apply a common mother code (e.g., with the same N and K parameters) to each PUCCH resource, and then rate match each PUCCH resource (e.g., separately based on each $E_{r,i}$ or based on $\Sigma_i E_{r,i}$). Additionally or alternatively, base station 105-b may encode DCI for a first control resource set (CORESET) and a second CORESET transmitted, respectively, for beam 205-a and 205-b, where each CORESET may include a different aggregation level. Accordingly, UE 115-a may apply a common mother code (e.g., with the same N and K parameters) to each CORESET, and then rate match each CORESET (e.g., separately based on each $E_{r,i}$ or based on $\Sigma_i E_{r,i}$). In some cases, base station 105-a may encode the same CORESET with multiple TCI states and different control channel element (CCE) sizes for each TCI state.

Figure 3:
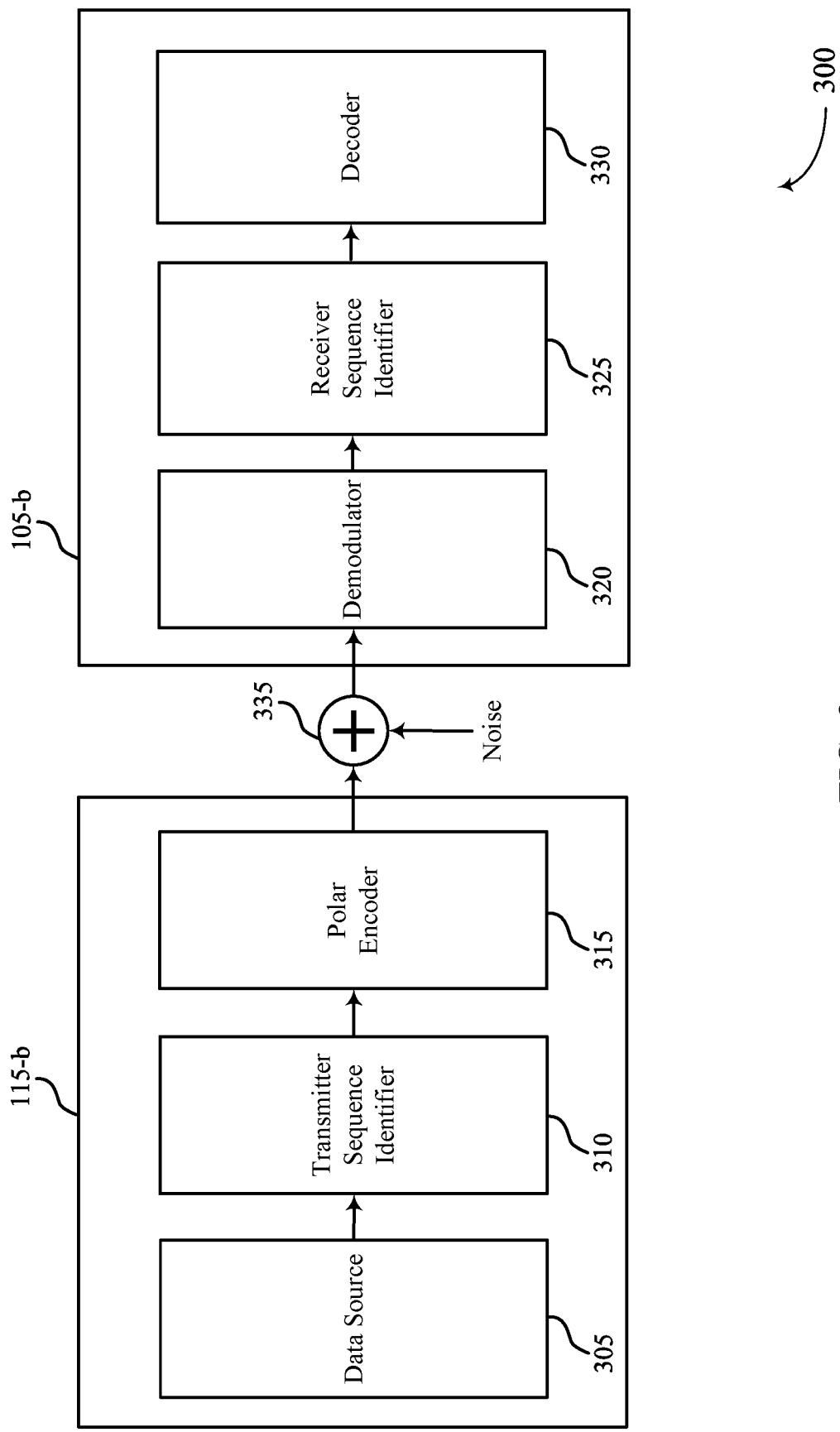
FIG. 3 illustrates an example of a polar encoding procedure that supports control channel mother code determination for multi-TCI communication in accordance with aspects of the present disclosure.

FIG. 3 illustrates an example of a polar encoding procedure 300 that supports control channel mother code determination for multi-TCI communication in accordance with aspects of the present disclosure. In some examples, polar encoding procedure 300 may implement aspects of wireless communications systems 100 and/or 200. In the example of FIG. 3, a UE 115-b may use polar encoding to encode information bits for transmission to a base station 105-b via a communication channel 335, where UE 115-b and base station 105-b may be examples of corresponding UEs 115 and base stations 105, respectively, as described with reference to FIGS. 1-2. In other examples, base station 105-b may encode data for transmission to UE 115-b or another base station 105 using these same techniques. In further examples, UE 115-b may encode data for transmission to another UE 115 using these same techniques. Moreover, devices other than base station 105-b and UE 115-b may use the techniques described herein for decoding a codeword encoded using a polar code. Communication channel 335 may include multiple TCI states. For example, communication channel 335 may be or include a control channel (e.g., an uplink control channel such as a PUCCH or a downlink control channel such as a PDCCH), where resources of the control channel are associated with two or more TCI states (e.g., two or more beams), such that each of the two or more TCI states are associated with a set of control channel resources of the control channel.

In the depicted example, UE 115-b may include a data source 305, a transmitter sequence identifier 310, and a polar encoder 315. The data source 305 may provide an information vector of K information bits to be encoded and transmitted to base station 105-b. The data source 305 may be coupled to a network, a storage device, or the like. The data source 305 may output the information vector to the transmitter sequence identifier 310. The transmitter sequence identifier 310 may identify bit indices to be used for the K information bits in a polar code with mother code length N. The transmitter sequence identifier 310 may output K information bits and the length N to the polar encoder 315 for polar encoding. In some cases, transmitter sequence identifier 310 may identify the bit indices for information bits based on a rate matching scheme used on an encoded output of the polar encoder 315.

On the receiving side, base station 105-b may identify a candidate codeword based on a candidate hypothesis (e.g., decoded resources, M:N:K hypothesis). For example, base station 105-b may employ a blind decoding process which tests multiple candidate hypotheses within a search space to determine if a successful decoding is performed for any of the candidate hypotheses. Demodulator 320 may demodulate the candidate codeword, which may include demapping received symbols associated with a set of resources to obtain a representation of the codeword. Demodulator 320 may then pass the representation of the codeword to a receiver sequence identifier 325. The receiver sequence identifier 325 may determine a length of the codeword and may identify bit indices of the polar code associated with information bits. The receiver sequence identifier 325 may output the bit indices and the representation of the codeword to decoder 330 to identify the most likely candidate path or paths for the information bits obtained from the codeword. The demodulated signal may be, for example, a sequence of logarithmic-likelihood ratio (LLR) values representing a probability value of a received bit being a '0' or a '1.' The decoder may perform a list decoding algorithm on the LLR values (e.g., successive cancellation list (SCL) decoding, maximum likelihood decoding) and may provide an output. If the decoder is able to decode the codeword successfully or partially decode the codeword, the decoder may output a bit sequence of the information vector (e.g., the K information bits) for use, storage, communication to another device, or the like.

Figure 4:
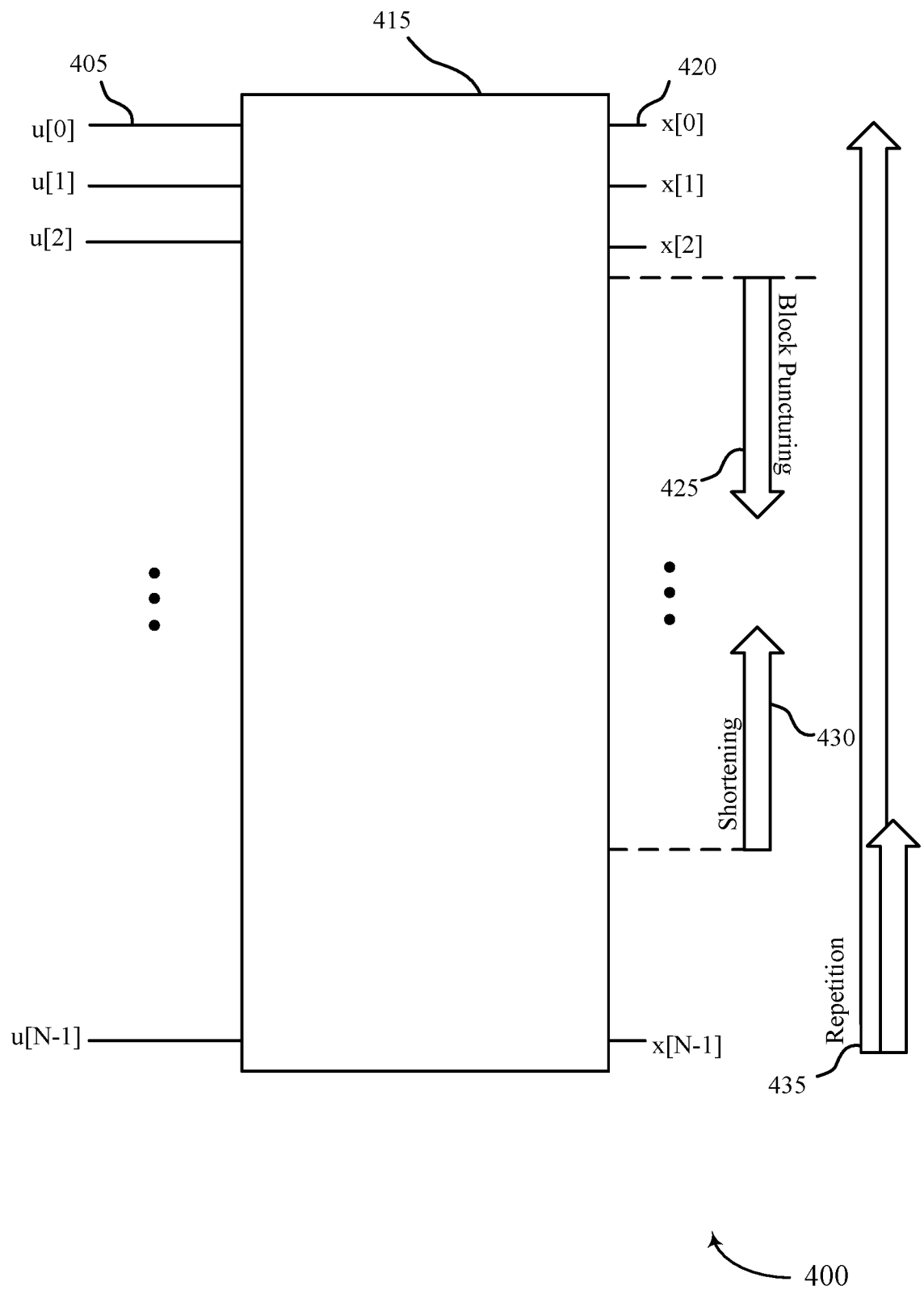
FIG. 4 illustrates an example of a rate matching procedure that supports control channel mother code determination for multi-TCI communication in accordance with aspects of the present disclosure.

FIG. 4 illustrates an example of a rate matching procedure 400 that supports control channel mother code determination for multi-TCI communication in accordance with aspects of the present disclosure. In some examples, rate matching procedure 400 may implement aspects of wireless communications systems 100, 200, and/or 300.

Rate matching procedure 400 depicts a polar code that includes N channels for generating a polar-encoded codeword 420 with channel 0 on top, followed by channel 1, and proceeding sequentially to channel N−1. Generator matrix 415 may be used by an encoder to encode information bits input to channels u[0:N−1] 405 to generate codeword channels x[0:N−1]. The generator matrix 415 may further be used by a decoder to decode information received on codeword channels x[0:N−1] to obtain a representation of the information bits and frozen bits on channels u[0:N−1].

A polar encoder (e.g., polar encoder 315 of FIG. 3) may allocate the most reliable channels of a polar code to information bits (e.g., K information bits) and the least reliable channels of the polar code to frozen bits (e.g., N−K frozen bits). A sequence identifier (e.g., transmitter sequence identifier 310 of FIG. 3) may generate a bit index sequence of length N to inform the polar encoder of the order in which to load bits into the channels (e.g., which K bit channels to select of the N bit channels), or may specify the locations for information bits (e.g., using a binary bit vector of length N).

In cases where rate matching is employed on the polar-encoded codeword 420, certain codeword channels (e.g., certain codeword channels included among codeword channels x[0:N−1]) may not be transmitted, or transmissions of certain codeword channels may be repeated. For example, if a block puncturing 425 rate matching scheme is used (where the arrow shows selection order of transmitted bits), a first number of codeword channels, starting at the beginning of the polar-encoded codeword 420 in the example of FIG. 4, may not be transmitted. If a shortening 430 rate matching scheme is used, a certain number of codeword channels at the end of the polar-encoded codeword 420 in the example of FIG. 4, may not be transmitted. If a repetition 435 rate matching scheme is used, the entire polar-encoded codeword 420 may be transmitted, with one or more codeword channels retransmitted.

Figure 5A:
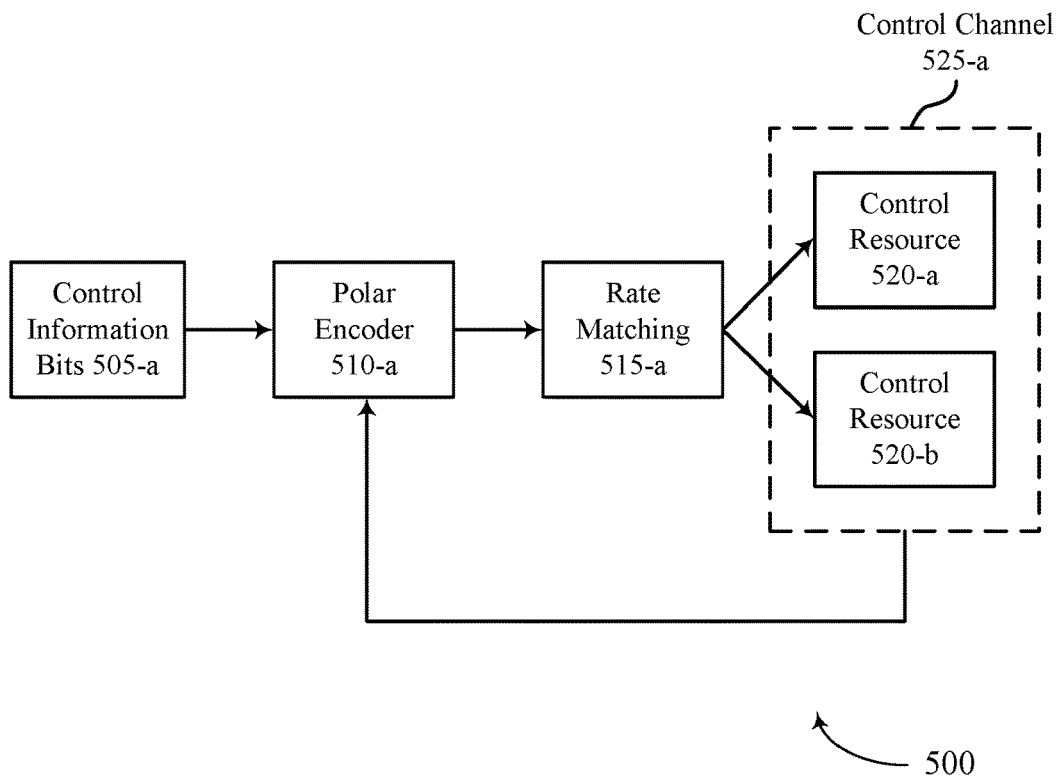
FIGS. 5A and 5B illustrate examples of polar encoding flows that support control channel mother code determination for multi-TCI communication in accordance with aspects of the present disclosure.

FIG. 5A illustrates an example of a polar encoding flow 500 that supports control channel mother code determination for multi-TCI communication in accordance with aspects of the present disclosure. In some examples, polar encoding flow 500 may implement aspects of wireless communications systems 100 and/or 200. Polar encoding flow 500 may include encoding, by an encoder, a set of control information bits 505-a (e.g., UCI, DCI, etc.) for transmitting control information to a decoder.

In some cases, a control channel (e.g., PUCCH or PDCCH) may include multiple resources that are transmitted according to separate TCI states, where each TCI state may include a different number of resource elements. For example, each set of control channel resources for a control channel may be transmitted on a separate beam utilized in beamformed communications. Accordingly, the encoder may transmit control information bits 505-a using a first transmit beam on a first set of resources (e.g., a first control channel resource on corresponding resource elements of a first TCI state) and using a second transmit beam on a second set of resources (e.g., a second control channel resource on corresponding resource elements of a second TCI state).

Additionally, the encoder may encode control information bits 505-a according to polar encoder 510-a based on determined parameter values for a polar code, where the parameter values are common for the first set of resources and the second set of resources (e.g., common mother code). In some cases, the parameter values for the polar code may include the number of information bits (K), a polar code block length (N), or a combination of K and N. Additionally, the polar code may be based on a first number of available coded bits for the first set of resources ($E_{r,0}$), a second number of available coded bits for the second set of resources ($E_{r,1}$), or a combination of $E_{r,0}$ and $E_{r,1}$. In some cases, the polar code may be based on a total number of resources (e.g., resource elements) across the first set of resources and the second set of resources. Additionally or alternatively, polar encoder 510-a may include an input vector that denotes one or more frozen bits and/or parity check bits that have the same location for both the first set of resources and the second set of resources. For example, for the parity check bits, the same location may include a lowest weight row of a generator matrix (e.g., $G_N$ matrix) for the polar code.

In some cases, the first set of resources and the second set of resources may be associated with different channel characteristics. Accordingly, the encoder may map higher reliability bits of control information bits 505-a to either the first set of resources or the second set of resources based on which set of resources has a higher channel characteristic. The channel characteristic may include an SNR, a signal-to-interference-plus-noise ratio (SINR), a signal strength, a signal quality, some other measurement of channel quality or performance, or some combination of measurements or characteristics of the channel. Additionally or alternatively, the channel characteristic may be based on QCL information, either determined by the encoder, or provided to the encoder. In some cases, the encoder may map code blocks based on priority. For example, the encoder may identify that a first code block for the control channel has a lower priority than a second code block to be mapped to the second set of resources for the control channel and map the first code block to a subset of the first set of resources based on the lower priority.

After encoding control information bits 505-a according to polar encoder 510-a, the encoder may then perform rate matching 515-a. In some cases, the encoder may rate match the encoded control information bits 505-a to a combination of the first set of resources and the second set of resources in order to determine control resources 520-a and 520-b of a control channel 525-a.

A decoder may receive one or more codewords on control resources 520-a and 520-b of control channel 525-a and may attempt to obtain the control information based on the received codeword(s). Decoder may use soft combination (e.g., incorporate a soft combining procedure) of decoding the encoded control information bits in control resource 520-a and the encoded control information bits in control resource 520-b. Since common parameters were used for the polar code of the polar encoding procedure performed at polar encoder 510-a, the decoder may be able to perform soft combining to decode the control information conveyed across control channel 525-a (e.g., the encoded control information bits in control resource 520-a and the encoded control information bits in control resource 520-b). As described herein, control channel 525-*a* and control information bits 505-*a* may be an uplink control channel (e.g., PUCCH) and UCI, respectively. Additionally or alternatively, control channel 525-*a* and control information bits 505-*a* may be a downlink control channel (e.g., PDCCH) and DCI, respectively.

Figure 5B:
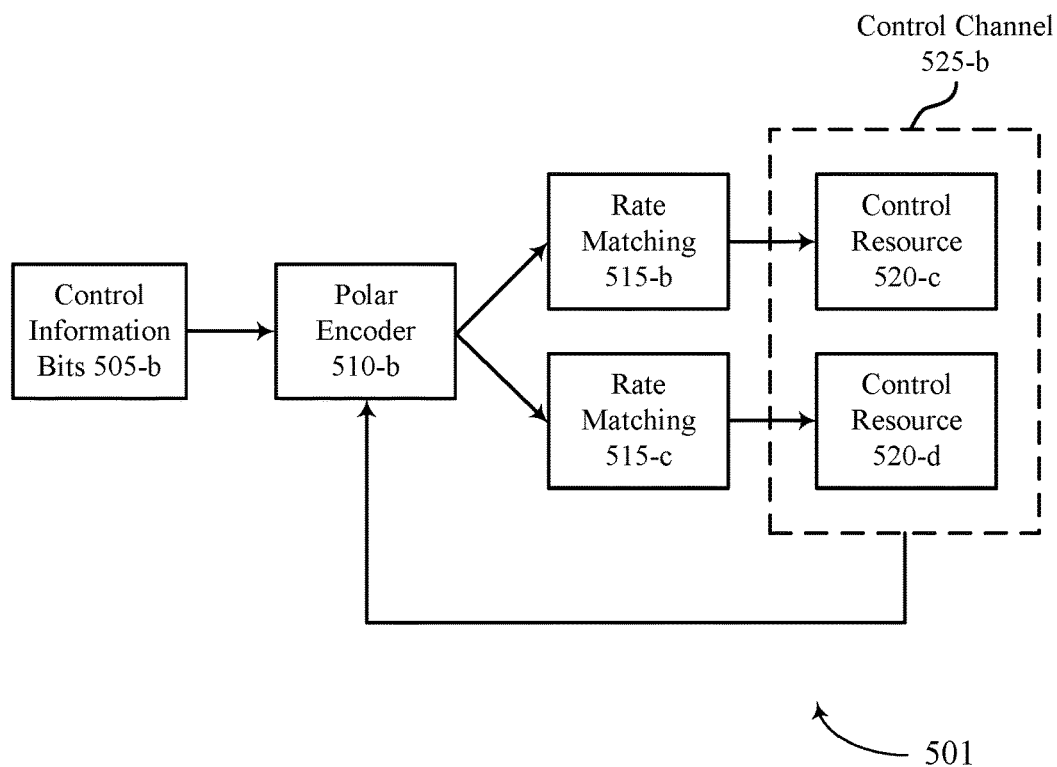

FIG. 5B illustrates an example of a polar encoding flow 501 that supports control channel mother code determination for multi-TCI communication in accordance with aspects of the present disclosure. In some examples, polar encoding flow 501 may implement aspects of wireless communications systems 100 and/or 200. Polar encoding flow 501 may include similar aspects of polar encoding flow 500 as described above with reference to FIG. 5A. According to polar encoding flow 501, for example, an encoder may encode a set of control information bits 505-*b* (e.g., UCI, DCI, etc.) for transmitting control information to a decoder. The encoder may encode the control information bits, for example, based on a polar code incorporated at the polar encoder 510-*b*.

Alternative to the polar encoding flow 500 FIG. 5A, polar encoding flow 501 may rate match the encoded control information bits to a first set of resources using a first rate matching procedure (e.g., rate matching 515-*b*) and may rate match the encoded control information bits to a second set of resources using a second rate matching procedure (e.g., rate matching 515-*c*). The first rate matching procedure and the second rate matching procedure may differ, for example, based on included puncturing, shortening, or repetition procedures, different amounts of puncturing, shortening, or repetition procedures, or any combination thereof.

Similar to polar encoding flow 500 of FIG. 5A, polar encoding flow 501 may then include mapping bits of control information bits 505-*b* to control resources 520-*c* and 520-*d* of a control channel 525-*b* based on the rate matchings 515-*b* and 515-*c*, respectively. A decoder may receive one or more codewords (e.g., transmitted across a wireless medium) and decode the received codewords according to a reverse process, taking into account the separate rate matching procedures respective to the separate sets of control channel resources, in an attempt to obtain the control information. The decoder may use soft combination (e.g., incorporate a soft combining procedure) of decoding the encoded control information bits in control resource 520-*c* and decoding the encoded control information bits in control resource 520-*d*, based on a set of common parameters used for the polar encoding procedure (e.g., based on a polar code incorporated at the polar encoder 510-*b*).

In some cases, polar encoder 510-*a* or 510-*b* may identify (e.g., based on measurements of the channel, or feedback from the decoding device, e.g., the receiver, regarding measurements of the channel, or both) channel characteristics associated with control channel 525-*a* or 525-*b*, respectively, which may be different for the different TCI states or beams. The encoding device (e.g., the transmitting device, such as a base station 105 or UE 115) may use the channel characteristic information for the channel (e.g., for the different TCI states or beams) in order to enhance the polar code. For example, the encoding device may use measurements of the SNR, SINR, receive power, transmit power, RSRP, RSRQ, etc., to determine the highest (or sets of higher) and lowest (or sets of lower) reliability channel for the polar encoder (e.g., the polar encoder 510-*a* or 510-*b*). The polar encoder may map certain information bits, such as higher priority bits, to the higher reliability channels of the polar code. Alternatively or additionally, the polar encoder may map the higher priority bits to the set of control channel resources associated with the TCI state or map the higher priority bits to the beam used by the control channel having the higher SNR, SINR, etc.

Figure 6:
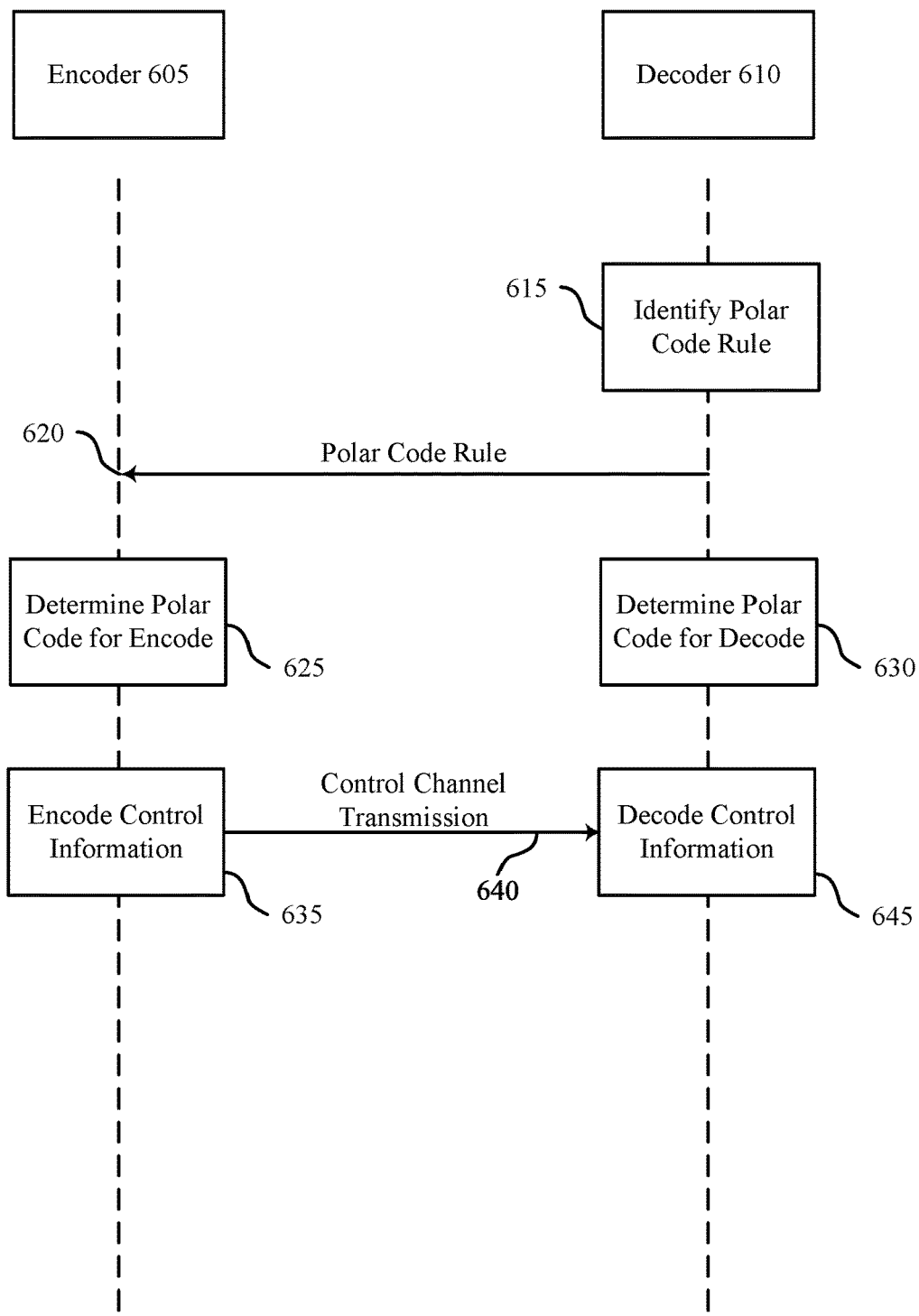
FIG. 6 illustrates an example of a process flow that supports control channel mother code determination for multi-TCI communication in accordance with aspects of the present disclosure.

FIG. 6 illustrates an example of process flow 600 that supports control channel mother code determination for multi-TCI communication in accordance with aspects of the present disclosure. In some examples, process flow 600 may implement aspects of wireless communications systems 100 and/or 200, polar encoding procedure 300, rate matching procedure 400 and/or polar encoding flow 500. Process flow 600 may include an encoder 605 (a wireless device which may encode control information) and a decoder 610 (a wireless device which may decode control information encoded by an encoding wireless device). In some cases, encoder 605 may be a UE 115 and decoder 610 may be a base station 105 as described above with reference to FIGS. 1-5, for example where the control information is UCI being transmitted on an uplink control channel. In some cases, encoder 605 may be a base station and decoder 610 may be a UE 115 as described above with reference to FIGS. 1-5, for example where the control information is DCI being transmitted on a downlink control channel. In other examples, control information may be encoded in a sidelink communication from one encoding device to a decoding device.

At 615, decoder 610 may identify a rule used to determine parameter values for a polar code based on the first set of resources of the control channel, the second set of resources of the control channel, and so on (for example, for three or more sets of control channel resources), as further describe herein, for example with reference to FIGS. 1-5.

At 620, decoder 610 may transmit an indication (e.g., polar code rule) of the rule to encoder 605. At 625, encoder 605 may use the indication of the rule to identify the polar code to be used to encode, at 635, control information to the transmitted on the control channel at 640. The transmission of the indication of the rule by the decoder 610 may include, for example, RRC signaling, or a DCI, or a MAC-CE. In some cases, encoder 605 may receive the indication of the rule from a base station 105, for example, in a case where the decoder 610 is a base station 105 and the control information is UCI.

Following transmission of the indication (e.g., polar code rule) at 620, decoder 610 may determine, at 630, parameter values for the polar code based on the rule. At 645, decoder 610 may then determine the polar code and decode control information transmitted by the encoder 605 on a control channel using multiple TCI states at 640.

Though process flow 600 provides an example in which the decoder 610 identifies a polar code rule at 615 and transmits the polar code rule at 620, in other examples, an encoder 605 may identify and transmit the polar code rule to the decoder 610. For example, where the control information is DCI and the control channel is a downlink control channel, a base station 105 may determine the polar code rule and transmit the same to an encoder, which may for example be a UE 115, for example via an indication of the rule in RRC signaling, DCI, or a MAC-CE. The encoder 605 (base station 105) may then identify the polar code using the polar code rule applicable to the multiple TCI states, such that the parameters for the polar code used to encode the DCI for the multiple sets of control resources of the downlink control channel include a common set of polar code parameters.

Figure 7:
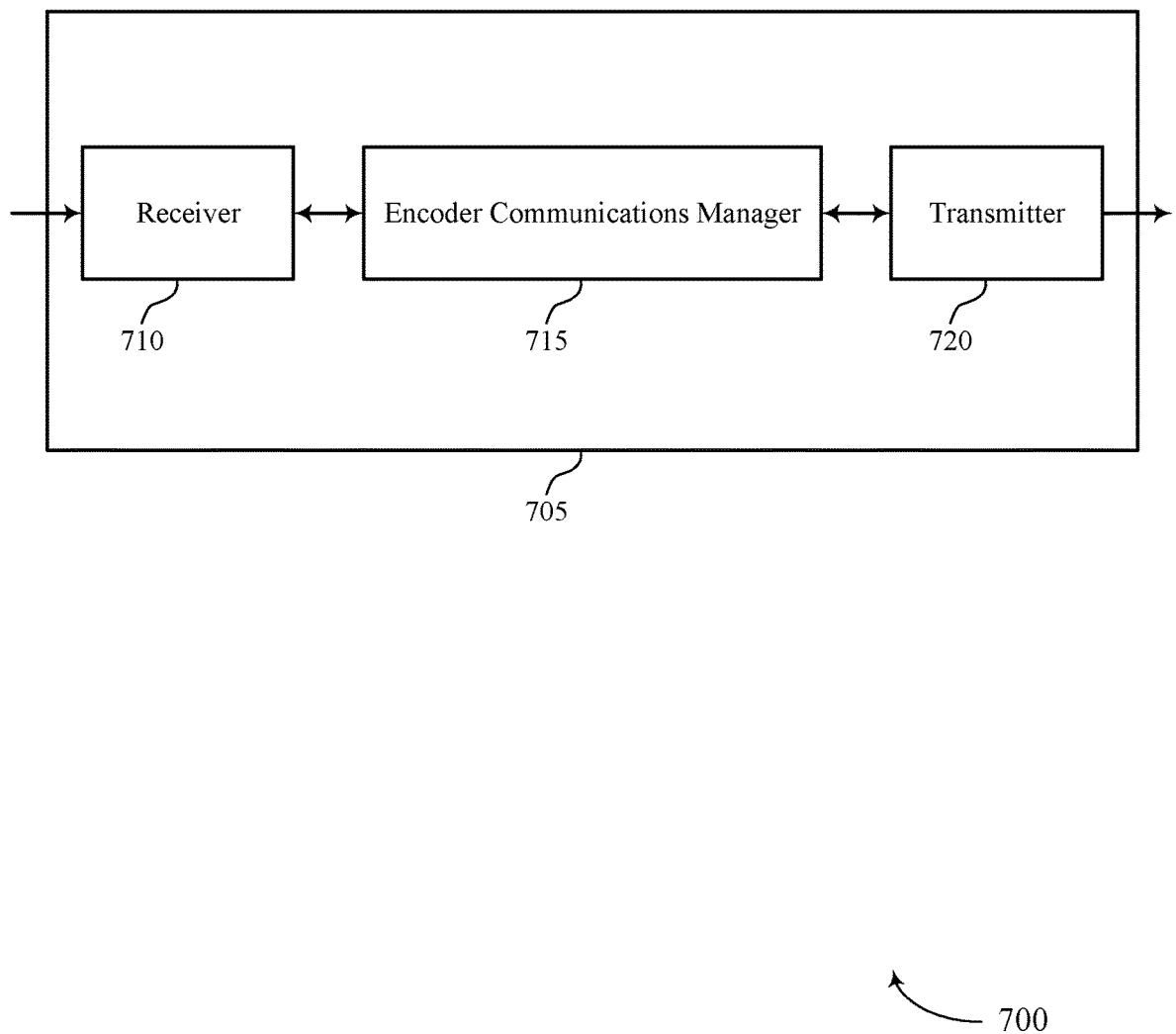
FIGS. 7 and 8 show block diagrams of devices that support control channel mother code determination for multi-TCI communication in accordance with aspects of the present disclosure.

FIG. 7 shows a block diagram 700 of a device 705 that supports control channel mother code determination for multi-TCI communication in accordance with aspects of the present disclosure. The device 705 may be an example of aspects of an encoder (e.g., a base station 105 or a UE 115 performing encoding of control information) as described herein. The device 705 may include a receiver 710, an encoder communications manager 715, and a transmitter 720. The device 705 may also include a processor. Each of these components may be in communication with one another (e.g., via one or more buses).

The receiver 710 may receive information such as packets, user data, or control information associated with various information channels (e.g., control channels, data channels, and information related to control channel mother code determination for multi-TCI communication, etc.). Information may be passed on to other components of the device 705. The receiver 710 may be an example of aspects of the transceiver 1020 described with reference to FIG. 10. The receiver 710 may utilize a single antenna or a set of antennas.

The encoder communications manager 715 may identify control information bits to be transmitted using a first transmit beam on a first set of resources of a control channel and transmitted using a second transmit beam on a second set of resources of the control channel, the second set of resources having a different number of resources than the first set of resources. The encoder communications manager 715 may then determine parameter values for a polar code based on the first set of resources and the second set of resources, at least one of the parameter values common to the polar code for the first set of resources and the second set of resources. Accordingly, the encoder communications manager 715 may encode the control information bits using the polar code having the determined parameter values to generate a codeword. Additionally, the encoder communications manager 715 may rate match the codeword to the first set of resources and the second set of resources. The encoder communications manager 715 may then transmit the rate matched codeword on the first set of resources using the first transmit beam and the second set of resources using the second transmit beam. The encoder communications manager 715 may be an example of aspects of the encoder communications manager 1010 described herein.

The encoder communications manager 715, or its subcomponents, may be implemented in hardware, code (e.g., software or firmware) executed by a processor, or any combination thereof. If implemented in code executed by a processor, the functions of the encoder communications manager 715, or its sub-components may be executed by a general-purpose processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described in the present disclosure.

The encoder communications manager 715, or its subcomponents, may be physically located at various positions, including being distributed such that portions of functions are implemented at different physical locations by one or more physical components. In some examples, the encoder communications manager 715, or its sub-components, may be a separate and distinct component in accordance with various aspects of the present disclosure. In some examples, the encoder communications manager 715, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 720 may transmit signals generated by other components of the device 705. In some examples, the transmitter 720 may be collocated with a receiver 710 in a transceiver module. For example, the transmitter 720 may be an example of aspects of the transceiver 1020 described with reference to FIG. 10. The transmitter 720 may utilize a single antenna or a set of antennas.

Figure 8:
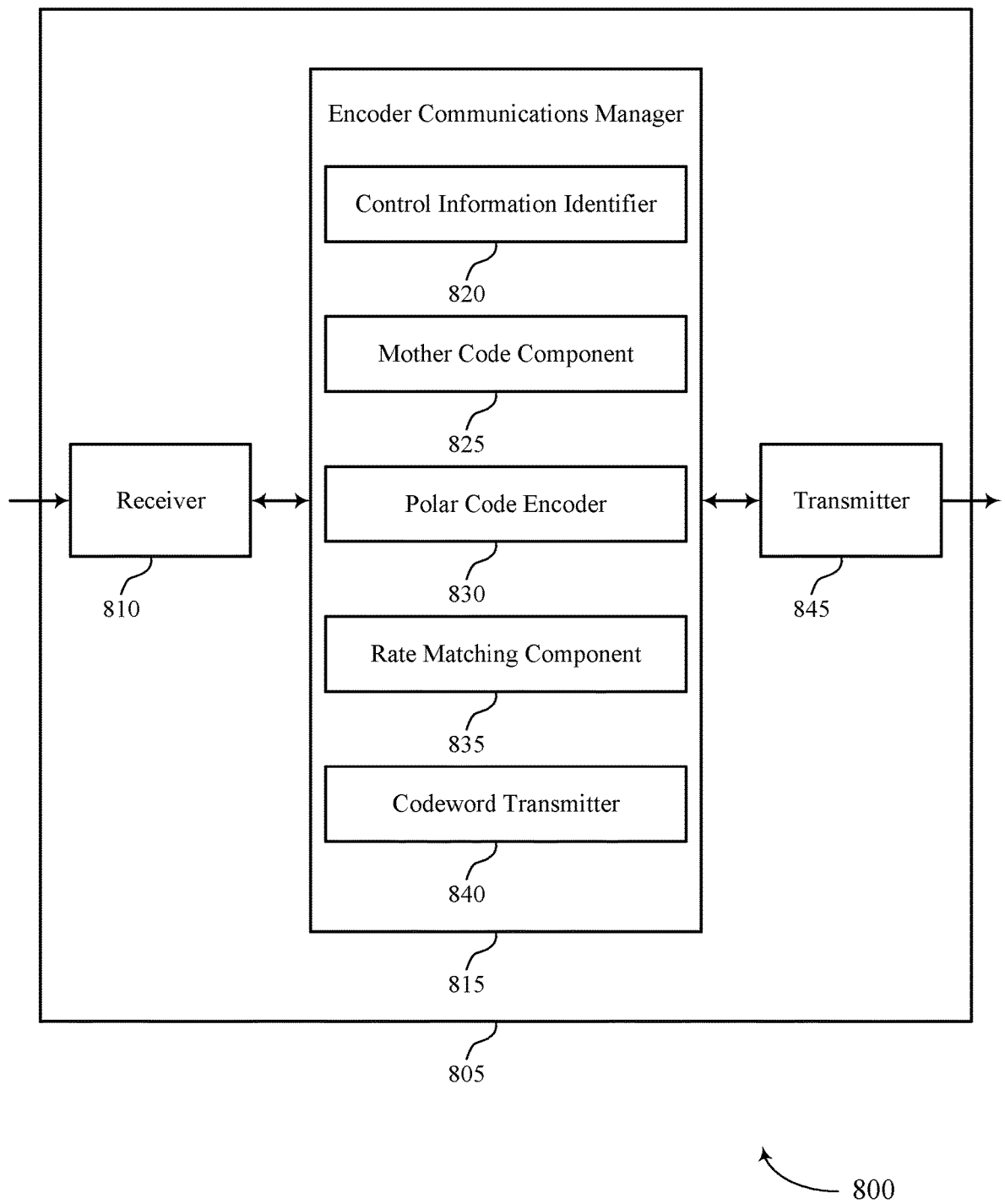

FIG. 8 shows a block diagram 800 of a device 805 that supports control channel mother code determination for multi-TCI communication in accordance with aspects of the present disclosure. The device 805 may be an example of aspects of a device 705 or a UE 115 or a base station 105 as described herein. The device 805 may include a receiver 810, an encoder communications manager 815, and a transmitter 845. The device 805 may also include a processor. Each of these components may be in communication with one another (e.g., via one or more buses).

The receiver 810 may receive information such as packets, user data, or control information associated with various information channels (e.g., control channels, data channels, and information related to control channel mother code determination for multi-TCI communication, etc.). Information may be passed on to other components of the device 805. The receiver 810 may be an example of aspects of the transceiver 1020 described with reference to FIG. 10. The receiver 810 may utilize a single antenna or a set of antennas.

The encoder communications manager 815 may be an example of aspects of the encoder communications manager 715 as described herein. The encoder communications manager 815 may include a control information identifier 820, a mother code component 825, a polar code encoder 830, a rate matching component 835, and a codeword transmitter 840. The encoder communications manager 815 may be an example of aspects of the encoder communications manager 1010 described herein.

The control information identifier 820 may identify control information bits to be transmitted using a first transmit beam on a first set of resources of a control channel and transmitted using a second transmit beam on a second set of resources of the control channel, the second set of resources having a different number of resources than the first set of resources.

The mother code component 825 may determine parameter values for a polar code based on the first set of resources and the second set of resources, at least one of the parameter values common to the polar code for the first set of resources and the second set of resources.

The polar code encoder 830 may encode the control information bits using the polar code having the determined parameter values to generate a codeword.

The rate matching component 835 may rate match the codeword to the first set of resources and the second set of resources.

The codeword transmitter 840 may transmit the rate matched codeword on the first set of resources using the first transmit beam and the second set of resources using the second transmit beam.

The transmitter 845 may transmit signals generated by other components of the device 805. In some examples, the transmitter 845 may be collocated with a receiver 810 in a transceiver module. For example, the transmitter 845 may be an example of aspects of the transceiver 1020 described with reference to FIG. 10. The transmitter 845 may utilize a single antenna or a set of antennas.

Figure 9:
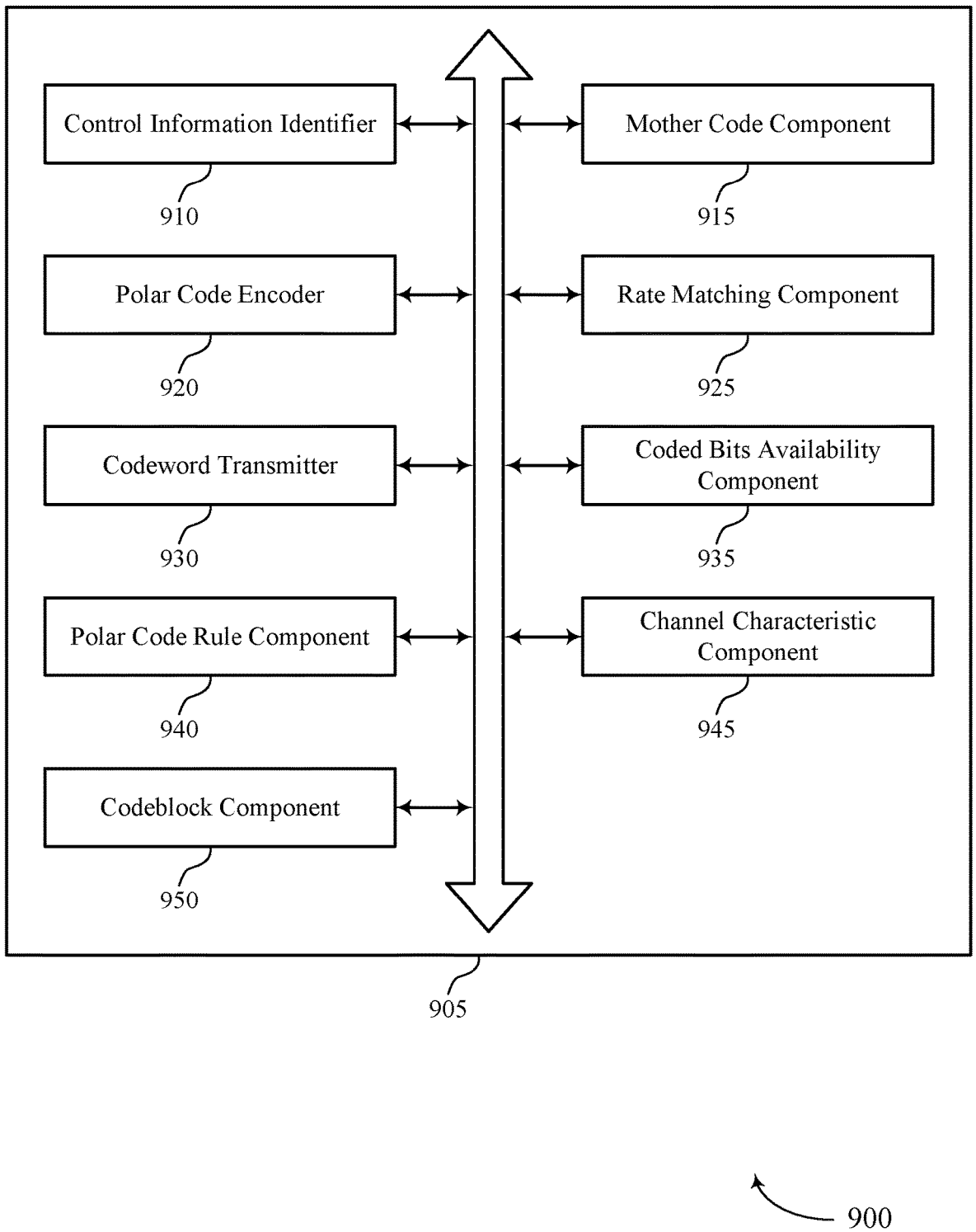
FIG. 9 shows a block diagram of a communications manager that supports control channel mother code determination for multi-TCI communication in accordance with aspects of the present disclosure.

FIG. 9 shows a block diagram 900 of a encoder communications manager 905 that supports control channel mother code determination for multi-TCI communication in accordance with aspects of the present disclosure. The encoder communications manager 905 may be an example of aspects of a encoder communications manager 715, a encoder communications manager 815, or a encoder communications manager 1010 described herein. The encoder communications manager 905 may include a control information identifier 910, a mother code component 915, a polar code encoder 920, a rate matching component 925, a codeword transmitter 930, a coded bits availability component 935, a polar code rule component 940, a channel characteristic component 945, and a codeblock component 950. Each of these modules may communicate, directly or indirectly, with one another (e.g., via one or more buses).

The control information identifier 910 may identify control information bits to be transmitted using a first transmit beam on a first set of resources of a control channel and transmitted using a second transmit beam on a second set of resources of the control channel, the second set of resources having a different number of resources than the first set of resources. In some cases, the control channel includes an uplink control channel, and the control information bits correspond to UCI. Additionally or alternatively, the control channel includes a downlink control channel, and the control information bits correspond to DCI.

The mother code component 915 may determine parameter values for a polar code based on the first set of resources and the second set of resources, at least one of the parameter values common to the polar code for the first set of resources and the second set of resources. In some examples, the mother code component 915 may identify a total number of resources across the first set of resources and the second set of resources and determine the parameter values for the polar code based on the identified total number of resources. In some cases, the at least one of the parameter values common to the polar code include a number of information bits of the polar code, or a block code length of the polar code, or a combination thereof. Additionally, the at least one of the parameter values common to the polar code for the first set of resources and the second set of resources may be associated with a first parameter for the polar code, and a first parameter value for a second parameter for the polar code for the first set of resources may be different than a second parameter value for the second parameter for the second set of resources.

The polar code encoder 920 may encode the control information bits using the polar code having the determined parameter values to generate a codeword. In some cases, an input vector of the polar code for the first set of resources includes one or more frozen bits with a same location in a second input vector of the polar code for the second set of resources. Additionally, an input vector of the polar code for the first set of resources includes one or more parity check bits with a same location in a second input vector of the polar code for the second set of resources. Accordingly, in some cases, the same location in the first input vector and the second input vector include a lowest weight row of a generator matrix for the polar code.

The rate matching component 925 may rate match the codeword to the first set of resources and the second set of resources. In some examples, the rate matching component 925 may rate match the codeword to the first set of resources using a first rate matching procedure and may rate match the codeword to the second set of resources using a second rate matching procedure different from the first rate matching procedure. In some examples, the rate matching component 925 may rate match the codeword to a combination of the first set of resources and the second set of resources. In some cases, the first rate matching procedure and the second rate matching procedure may include puncturing, or shortening, or repetition, or a combination thereof, where the second rate matching procedure is different than the first rate matching procedure.

The codeword transmitter 930 may transmit the rate matched codeword on the first set of resources using the first transmit beam and the second set of resources using the second transmit beam.

The coded bits availability component 935 may identify a first number of available coded bits for the first set of resources. In some examples, the coded bits availability component 935 may identify a second number of available coded bits for the second set of resources. Accordingly, the coded bits availability component 935 may determine the parameter values for the polar code based on the first number of available coded bits, or the second number of available coded bits, or a combination thereof, and the first set of resources and the second set of resources.

The polar code rule component 940 may identify a rule used to determine the parameter values for the polar code. In some examples, the polar code rule component 940 may determine the parameter values for the polar code based on the identified rule, the first set of resources, and the second set of resources. In some examples, the polar code rule component 940 may receive (e.g., communicate) an indication of the rule from a base station, where the rule is identified based on the received indication. In some examples, the polar code rule component 940 may receive the indication of the rule in RRC signaling, or a DCI, or a MAC-CE. Additionally or alternatively, the polar code rule component 940 may transmit (e.g., communicate) an indication of the rule to a UE for the UE to use to decode the rate matched codeword. Accordingly, the polar code rule component 940 may transmit the indication in RRC signaling, or a DCI, or a MAC-CE.

The channel characteristic component 945 may identify one of the first set of resources or the second set of resources as having a higher value of a channel characteristic. In some examples, the channel characteristic component 945 may map higher reliability bits of the control information bits to the one of the first set of resources or the second set of resources having the higher value of the channel characteristic. In some examples, the channel characteristic component 945 may identify values of the channel characteristic for the first set of resources of the control channel, or the second set of resources of the control channel, or a combination thereof, based on quasi-co-location information. In some cases, the channel characteristic includes a SNR, or a signal-to-interference-plus-noise ratio (SINR), or a signal strength, or a signal quality, or a combination thereof.

The codeblock component 950 may identify that a first codeblock for the control channel has a lower priority than a second codeblock to be mapped to the second set of resources for the control channel. In some examples, the codeblock component 950 may map the first codeblock to a subset of the first set of resources based on the lower priority.

Figure 10:
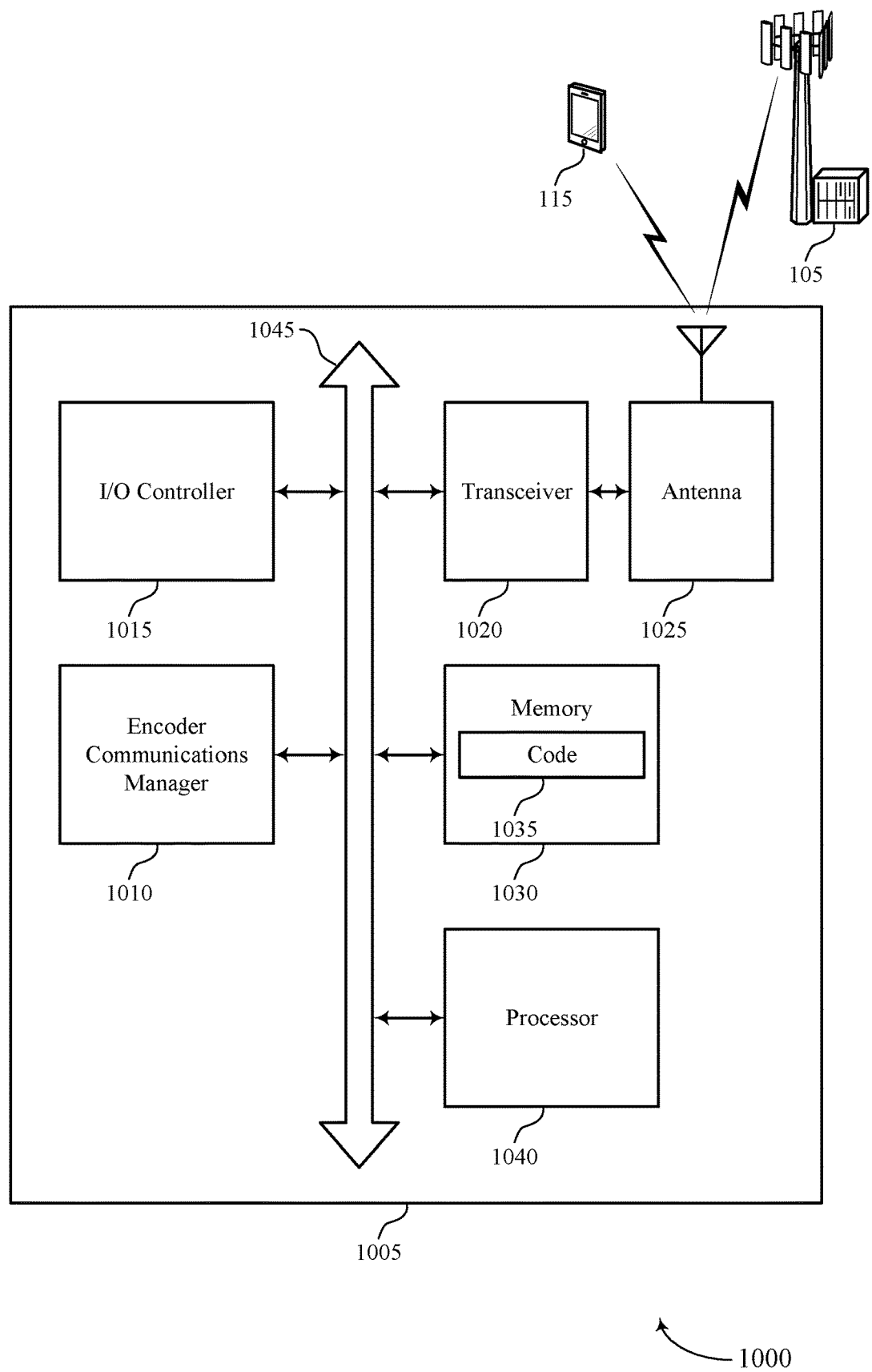
FIG. 10 shows a diagram of a system including a device that supports control channel mother code determination for multi-TCI communication in accordance with aspects of the present disclosure.

FIG. 10 shows a diagram of a system 1000 including a device 1005 that supports control channel mother code determination for multi-TCI communication in accordance with aspects of the present disclosure. The device 1005 may be an example of or include the components of device 705, device 805, or a UE 115, or a base station 105, as described herein. The device 1005 may include components for bi-directional voice and data communications including components for transmitting and receiving communications, including a encoder communications manager 1010, an I/O controller 1015, a transceiver 1020, an antenna 1025, memory 1030, and a processor 1040. These components may be in electronic communication via one or more buses (e.g., bus 1045).

The encoder communications manager 1010 may identify control information bits to be transmitted using a first transmit beam on a first set of resources of a control channel and transmitted using a second transmit beam on a second set of resources of the control channel, the second set of resources having a different number of resources than the first set of resources. The encoder communications manager 1010 may then determine parameter values for a polar code based on the first set of resources and the second set of resources, at least one of the parameter values common to the polar code for the first set of resources and the second set of resources. Accordingly, the encoder communications manager 1010 may encode the control information bits using the polar code having the determined parameter values to generate a codeword. Additionally, the encoder communications manager 1010 may rate match the codeword to the first set of resources and the second set of resources. The encoder communications manager 1010 may then transmit the rate matched codeword on the first set of resources using the first transmit beam and the second set of resources using the second transmit beam.

The I/O controller 1015 may manage input and output signals for the device 1005. The I/O controller 1015 may also manage peripherals not integrated into the device 1005. In some cases, the I/O controller 1015 may represent a physical connection or port to an external peripheral. In some cases, the I/O controller 1015 may utilize an operating system such as iOS®, ANDROID®, MS-DOS®, MS-WINDOWS®, OS/2®, UNIX®, LINUX®, or another known operating system. In other cases, the I/O controller 1015 may represent or interact with a modem, a keyboard, a mouse, a touchscreen, or a similar device. In some cases, the I/O controller 1015 may be implemented as part of a processor. In some cases, a user may interact with the device 1005 via the I/O controller 1015 or via hardware components controlled by the I/O controller 1015.

The transceiver 1020 may communicate bi-directionally, via one or more antennas, wired, or wireless links as described above. For example, the transceiver 1020 may represent a wireless transceiver and may communicate bi-directionally with another wireless transceiver. The transceiver 1020 may also include a modem to modulate the packets and provide the modulated packets to the antennas for transmission, and to demodulate packets received from the antennas.

In some cases, the wireless device may include a single antenna 1025. However, in some cases the device may have more than one antenna 1025, which may be capable of concurrently transmitting or receiving multiple wireless transmissions.

The memory 1030 may include random-access memory (RAM) and read-only memory (ROM). The memory 1030 may store computer-readable, computer-executable code 1035 including instructions that, when executed, cause the processor to perform various functions described herein. In some cases, the memory 1030 may contain, among other things, a basic input/output system (BIOS) which may control basic hardware or software operation such as the interaction with peripheral components or devices.

The processor 1040 may include an intelligent hardware device, (e.g., a general-purpose processor, a DSP, a CPU, a microcontroller, an ASIC, an FPGA, a PLD, a discrete gate or transistor logic component, a discrete hardware component, or any combination thereof). In some cases, the processor 1040 may be configured to operate a memory array using a memory controller. In other cases, a memory controller may be integrated into the processor 1040. The processor 1040 may be configured to execute computer-readable instructions stored in a memory (e.g., the memory 1030) to cause the device 1005 to perform various functions (e.g., functions or tasks supporting control channel mother code determination for multi-TCI communication).

The code 1035 may include instructions to implement aspects of the present disclosure, including instructions to support wireless communications. The code 1035 may be stored in a non-transitory computer-readable medium such as system memory or other type of memory. In some cases, the code 1035 may not be directly executable by the processor 1040 but may cause a computer (e.g., when compiled and executed) to perform functions described herein.

Figure 11:
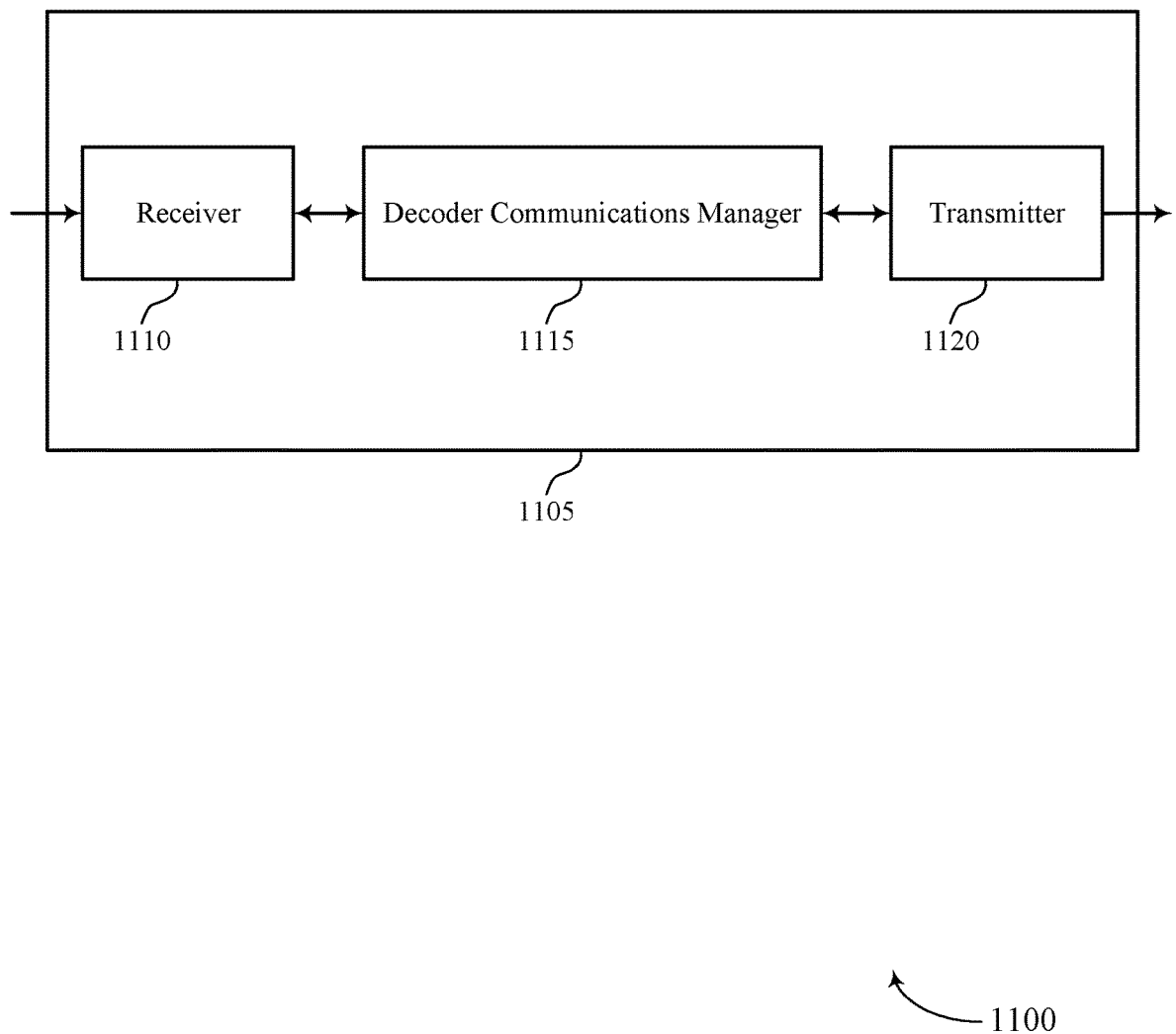
FIGS. 11 and 12 show block diagrams of devices that support control channel mother code determination for multi-TCI communication in accordance with aspects of the present disclosure.

FIG. 11 shows a block diagram 1100 of a device 1105 that supports control channel mother code determination for multi-TCI communication in accordance with aspects of the present disclosure. The device 1105 may be an example of aspects of a decoder (e.g., a base station 105 or a UE 115 performing decoding of control information received from an encoder) as described herein. The device 1105 may include a receiver 1110, a decoder communications manager 1115, and a transmitter 1120. The device 1105 may also include a processor. Each of these components may be in communication with one another (e.g., via one or more buses).

The receiver 1110 may receive information such as packets, user data, or control information associated with various information channels (e.g., control channels, data channels, and information related to control channel mother code determination for multi-TCI communication, etc.). Information may be passed on to other components of the device 1105. The receiver 1110 may be an example of aspects of the transceiver 1420 described with reference to FIG. 14. The receiver 1110 may utilize a single antenna or a set of antennas.

The decoder communications manager 1115 may receive a first codeword on a first set of resources of a control channel using a first receive beam and a second codeword on a second set of resources of the control channel using a second receive beam, the second set of resources having a different number of resources than the first set of resources, where the first codeword and the second codeword correspond to control information bits encoded using a polar code having at least one parameter value common to the polar code for the first set of resources and the second set of resources. The decoder communications manager 1115 may then decode the first codeword and the second codeword according to the polar code and a rate matching procedure. Accordingly, the decoder communications manager 1115 may obtain the control information bits based on the decoded first codeword and the decoded second codeword. The decoder communications manager 1115 may be an example of aspects of the decoder communications manager 1410 described herein.

The decoder communications manager 1115, or its sub-components, may be implemented in hardware, code (e.g., software or firmware) executed by a processor, or any combination thereof. If implemented in code executed by a processor, the functions of the decoder communications manager 1115, or its sub-components may be executed by a general-purpose processor, a DSP, an ASIC, an FPGA or other PLD, discrete gate or transistor logic, discrete hardware components, or any combination thereof designed to perform the functions described in the present disclosure.

The decoder communications manager 1115, or its sub-components, may be physically located at various positions, including being distributed such that portions of functions are implemented at different physical locations by one or more physical components. In some examples, the decoder communications manager 1115, or its sub-components, may be a separate and distinct component in accordance with various aspects of the present disclosure. In some examples, the decoder communications manager 1115, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 1120 may transmit signals generated by other components of the device 1105. In some examples, the transmitter 1120 may be collocated with a receiver 1110 in a transceiver module. For example, the transmitter 1120 may be an example of aspects of the transceiver 1420 described with reference to FIG. 14. The transmitter 1120 may utilize a single antenna or a set of antennas.

Figure 12:
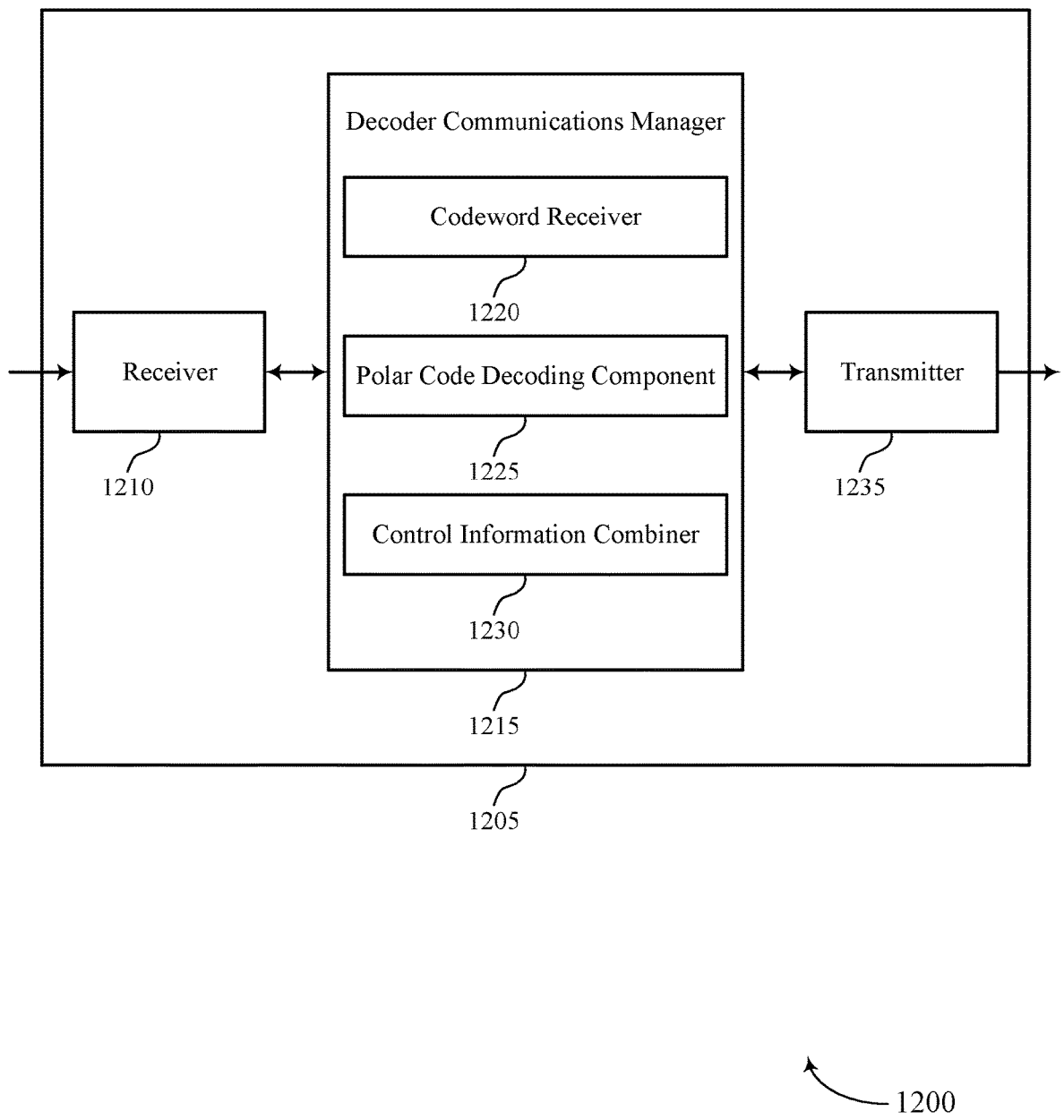

FIG. 12 shows a block diagram 1200 of a device 1205 that supports control channel mother code determination for multi-TCI communication in accordance with aspects of the present disclosure. The device 1205 may be an example of aspects of a device 1105, or a base station 105, or a UE 115 as described herein. The device 1205 may include a receiver 1210, a decoder communications manager 1215, and a transmitter 1235. The device 1205 may also include a processor. Each of these components may be in communication with one another (e.g., via one or more buses).

The receiver 1210 may receive information such as packets, user data, or control information associated with various information channels (e.g., control channels, data channels, and information related to control channel mother code determination for multi-TCI communication, etc.). Information may be passed on to other components of the device 1205. The receiver 1210 may be an example of aspects of the transceiver 1420 described with reference to FIG. 14. The receiver 1210 may utilize a single antenna or a set of antennas.

The decoder communications manager 1215 may be an example of aspects of the decoder communications manager 1115 as described herein. The decoder communications manager 1215 may include a codeword receiver 1220, a polar code decoding component 1225, and a control information combiner 1230. The decoder communications manager 1215 may be an example of aspects of the decoder communications manager 1410 described herein.

The codeword receiver 1220 may receive a first codeword on a first set of resources of a control channel using a first receive beam and a second codeword on a second set of resources of the control channel using a second receive beam, the second set of resources having a different number of resources than the first set of resources, where the first codeword and the second codeword correspond to control information bits encoded using a polar code having at least one parameter value common to the polar code for the first set of resources and the second set of resources.

The polar code decoding component 1225 may decode the first codeword and the second codeword according to the polar code and a rate matching procedure.

The control information combiner 1230 may obtain the control information bits based on the decoded first codeword and the decoded second codeword.

The transmitter 1235 may transmit signals generated by other components of the device 1205. In some examples, the transmitter 1235 may be collocated with a receiver 1210 in a transceiver module. For example, the transmitter 1235 may be an example of aspects of the transceiver 1420 described with reference to FIG. 14. The transmitter 1235 may utilize a single antenna or a set of antennas.

Figure 13:
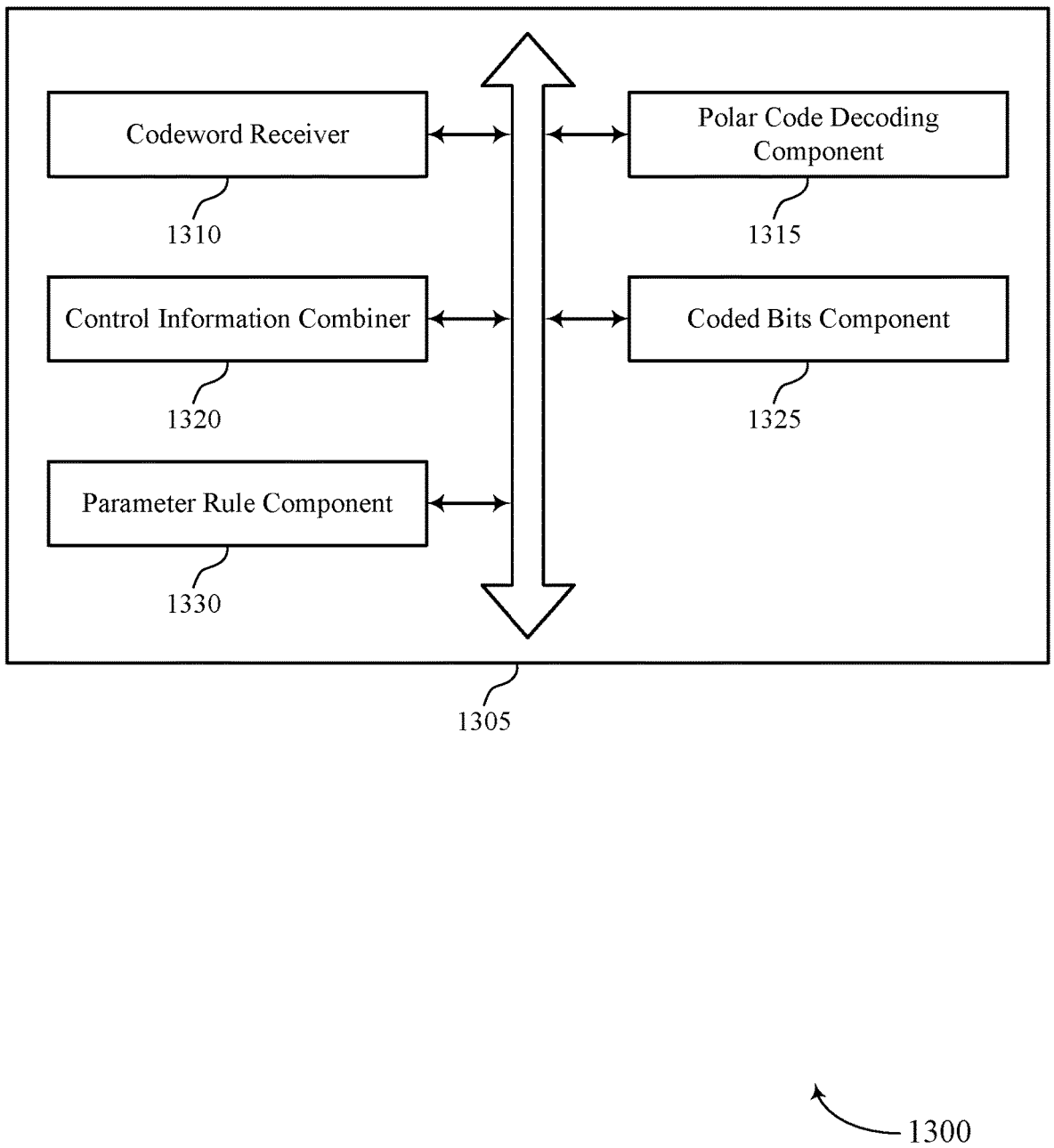
FIG. 13 shows a block diagram of a communications manager that supports control channel mother code determination for multi-TCI communication in accordance with aspects of the present disclosure.

FIG. 13 shows a block diagram 1300 of a decoder communications manager 1305 that supports control channel mother code determination for multi-TCI communication in accordance with aspects of the present disclosure. The decoder communications manager 1305 may be an example of aspects of a decoder communications manager 1115, a decoder communications manager 1215, or a decoder communications manager 1410 described herein. The decoder communications manager 1305 may include a codeword receiver 1310, a polar code decoding component 1315, a control information combiner 1320, a coded bits component 1325, and a parameter rule component 1330. Each of these modules may communicate, directly or indirectly, with one another (e.g., via one or more buses).

The codeword receiver 1310 may receive a first codeword on a first set of resources of a control channel using a first receive beam and a second codeword on a second set of resources of the control channel using a second receive beam, the second set of resources having a different number of resources than the first set of resources, where the first codeword and the second codeword correspond to control information bits encoded using a polar code having at least one parameter value common to the polar code for the first set of resources and the second set of resources. In some examples, the codeword receiver 1310 may identify a total number of resources across the first set of resources and the second set of resources. In some examples, the codeword receiver 1310 may determine the at least one parameter value common to the polar code based on the identified total number of resources. In some cases, the at least one parameter value common to the polar code include a number of information bits of the polar code, or a block code length of the polar code, or a combination thereof. In some cases, the control channel includes an uplink control channel, and the control information bits correspond to uplink control information. Additionally or alternatively, the control channel includes a downlink control channel, and the control information bits correspond to downlink control information.

The polar code decoding component 1315 may decode the first codeword and the second codeword according to the polar code and a rate matching procedure. In some examples, the polar code decoding component 1315 may decode the first codeword according to the polar code and a first rate matching procedure. In some examples, the polar code decoding component 1315 may decode the second codeword according to the polar code and a second rate matching procedure, the second rate matching procedure different from the first rate matching procedure. In some examples, the polar code decoding component 1315 may decode the first codeword and the second codeword according to the polar code and the rate matching procedure for a combination of the first set of resources and the second set of resources.

The control information combiner 1320 may obtain the control information bits based on the decoded first codeword and the decoded second codeword. In some examples, the control information combiner 1320 may perform soft combining of the first codeword and the second codeword to obtain the control information bits.

The coded bits component 1325 may identify a first number of available coded bits for the first set of resources. In some examples, the coded bits component 1325 may identify a second number of available coded bits for the second set of resources. In some examples, the coded bits component 1325 may determine the at least one parameter value common to the polar code based on the first number of available coded bits, or the second number of available coded bits, or a combination thereof.

The parameter rule component 1330 may identify a rule used to determine the at least one parameter value common to the polar code. In some examples, the parameter rule component 1330 may determine the at least one parameter value based on the identified rule, the first set of resources, and the second set of resources. In some examples, the parameter rule component 1330 may transmit (e.g., communicate) an indication of the rule to a UE, where the rule is identified based on the received indication. In some examples, the parameter rule component 1330 may transmit the indication in RRC control signaling, or a DCI, or a MAC-CE. Additionally or alternatively, the parameter rule component 1330 may receive (e.g., communicate) an indication of the rule from a base station. Accordingly, the parameter rule component 1330 may receive the indication of the rule in RRC signaling, or a DCI, or a MAC-CE.

Figure 14:
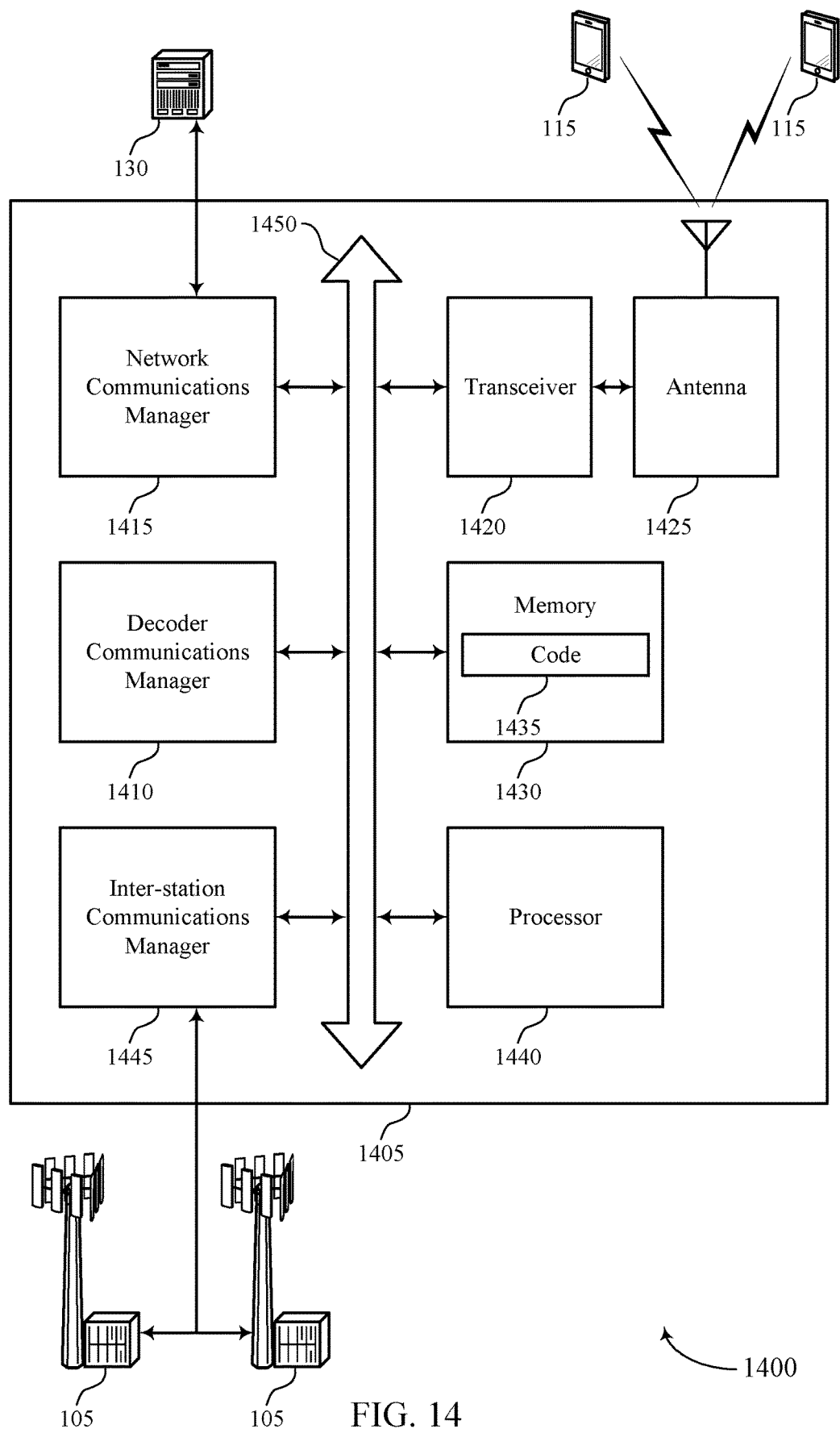
FIG. 14 shows a diagram of a system including a device that supports control channel mother code determination for multi-TCI communication in accordance with aspects of the present disclosure.

FIG. 14 shows a diagram of a system 1400 including a device 1405 that supports control channel mother code determination for multi-TCI communication in accordance with aspects of the present disclosure. The device 1405 may be an example of or include the components of device 1105, device 1205, or a base station 105, or a UE 115, as described herein. The device 1405 may include components for bi-directional voice and data communications including components for transmitting and receiving communications, including a decoder communications manager 1410, a network communications manager 1415, a transceiver 1420, an antenna 1425, memory 1430, a processor 1440, and an inter-station communications manager 1445. These components may be in electronic communication via one or more buses (e.g., bus 1450).

The decoder communications manager 1410 may receive a first codeword on a first set of resources of a control channel using a first receive beam and a second codeword on a second set of resources of the control channel using a second receive beam, the second set of resources having a different number of resources than the first set of resources, where the first codeword and the second codeword correspond to control information bits encoded using a polar code having parameter values common to the polar code for the first set of resources and the second set of resources. The decoder communications manager 1115 may then decode the first codeword and the second codeword according to the polar code and a rate matching procedure. Accordingly, the decoder communications manager 1115 may obtain the control information bits based on the decoded first codeword and the decoded second codeword.

The network communications manager 1415 may manage communications with the core network (e.g., via one or more wired backhaul links). For example, the network communications manager 1415 may manage the transfer of data communications for client devices, such as one or more UEs 115.

The transceiver 1420 may communicate bi-directionally, via one or more antennas, wired, or wireless links as described above. For example, the transceiver 1420 may represent a wireless transceiver and may communicate bi-directionally with another wireless transceiver. The transceiver 1420 may also include a modem to modulate the packets and provide the modulated packets to the antennas for transmission, and to demodulate packets received from the antennas.

In some cases, the wireless device may include a single antenna 1425. However, in some cases the device may have more than one antenna 1425, which may be capable of concurrently transmitting or receiving multiple wireless transmissions.

The memory 1430 may include RAM, ROM, or a combination thereof. The memory 1430 may store computer-readable code 1435 including instructions that, when executed by a processor (e.g., the processor 1440) cause the device to perform various functions described herein. In some cases, the memory 1430 may contain, among other things, a BIOS which may control basic hardware or software operation such as the interaction with peripheral components or devices.

The processor 1440 may include an intelligent hardware device, (e.g., a general-purpose processor, a DSP, a CPU, a microcontroller, an ASIC, an FPGA, a PLD, a discrete gate or transistor logic component, a discrete hardware component, or any combination thereof). In some cases, the processor 1440 may be configured to operate a memory array using a memory controller. In some cases, a memory controller may be integrated into processor 1440. The processor 1440 may be configured to execute computer-readable instructions stored in a memory (e.g., the memory 1430) to cause the device #{device} to perform various functions (e.g., functions or tasks supporting control channel mother code determination for multi-TCI communication).

The inter-station communications manager 1445 may manage communications with other base station 105, and may include a controller or scheduler for controlling communications with UEs 115 in cooperation with other base stations 105. For example, the inter-station communications manager 1445 may coordinate scheduling for transmissions to UEs 115 for various interference mitigation techniques such as beamforming or joint transmission. In some examples, the inter-station communications manager 1445 may provide an X2 interface within an LTE/LTE-A wireless communication network technology to provide communication between base stations 105.

The code 1435 may include instructions to implement aspects of the present disclosure, including instructions to support wireless communications. The code 1435 may be stored in a non-transitory computer-readable medium such as system memory or other type of memory. In some cases, the code 1435 may not be directly executable by the processor 1440 but may cause a computer (e.g., when compiled and executed) to perform functions described herein.

Figure 15:
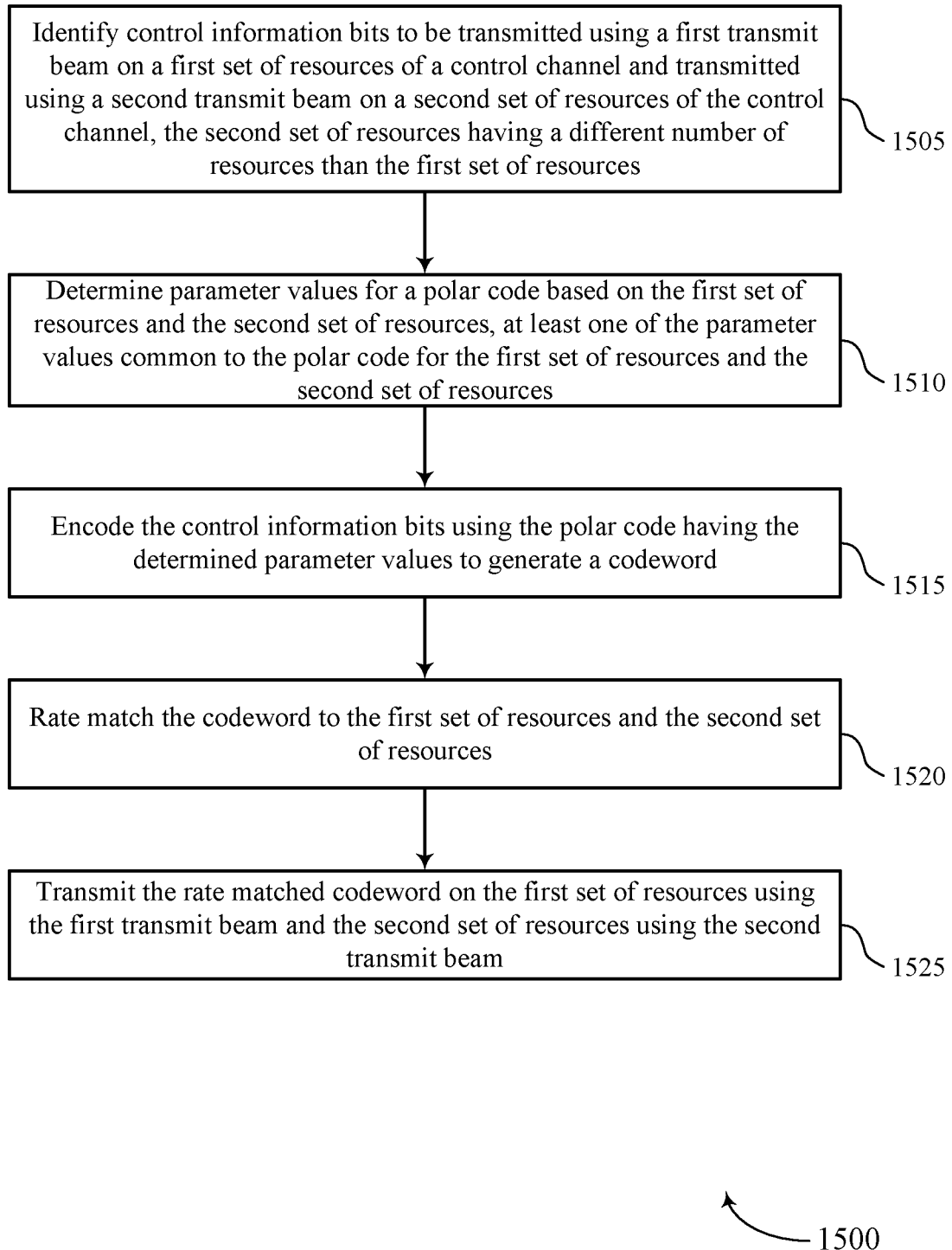
FIGS. 15 through 19 show flowcharts illustrating methods that support control channel mother code determination for multi-TCI communication in accordance with aspects of the present disclosure.

FIG. 15 shows a flowchart illustrating a method 1500 that supports control channel mother code determination for multi-TCI communication in accordance with aspects of the present disclosure. The operations of method 1500 may be implemented by an encoder or its components as described herein. For example, the operations of method 1500 may be performed by an encoder communications manager as described with reference to FIGS. 7 through 10. In some examples, an encoder may execute a set of instructions to control the functional elements of the encoder to perform the functions described below. Additionally or alternatively, an encoder may perform aspects of the functions described below using special-purpose hardware.

At 1505, the encoder may identify control information bits to be transmitted using a first transmit beam on a first set of resources of a control channel and transmitted using a second transmit beam on a second set of resources of the control channel, the second set of resources having a different number of resources than the first set of resources. The operations of 1505 may be performed according to the methods described herein. In some examples, aspects of the operations of 1505 may be performed by a control information identifier as described with reference to FIGS. 7 through 10.

At 1510, the encoder may determine parameter values for a polar code based on the first set of resources and the second set of resources, at least one of the parameter values common to the polar code for the first set of resources and the second set of resources. The operations of 1510 may be performed according to the methods described herein. In some examples, aspects of the operations of 1510 may be performed by a mother code component as described with reference to FIGS. 7 through 10.

At 1515, the encoder may encode the control information bits using the polar code having the determined parameter values to generate a codeword. The operations of 1515 may be performed according to the methods described herein. In some examples, aspects of the operations of 1515 may be performed by a polar code encoder as described with reference to FIGS. 7 through 10.

At 1520, the encoder may rate match the codeword to the first set of resources and the second set of resources. The operations of 1520 may be performed according to the methods described herein. In some examples, aspects of the operations of 1520 may be performed by a rate matching component as described with reference to FIGS. 7 through 10.

At 1525, the encoder may transmit the rate matched codeword on the first set of resources using the first transmit beam and the second set of resources using the second transmit beam. The operations of 1525 may be performed according to the methods described herein. In some examples, aspects of the operations of 1525 may be performed by a codeword transmitter as described with reference to FIGS. 7 through 10.

Figure 16:
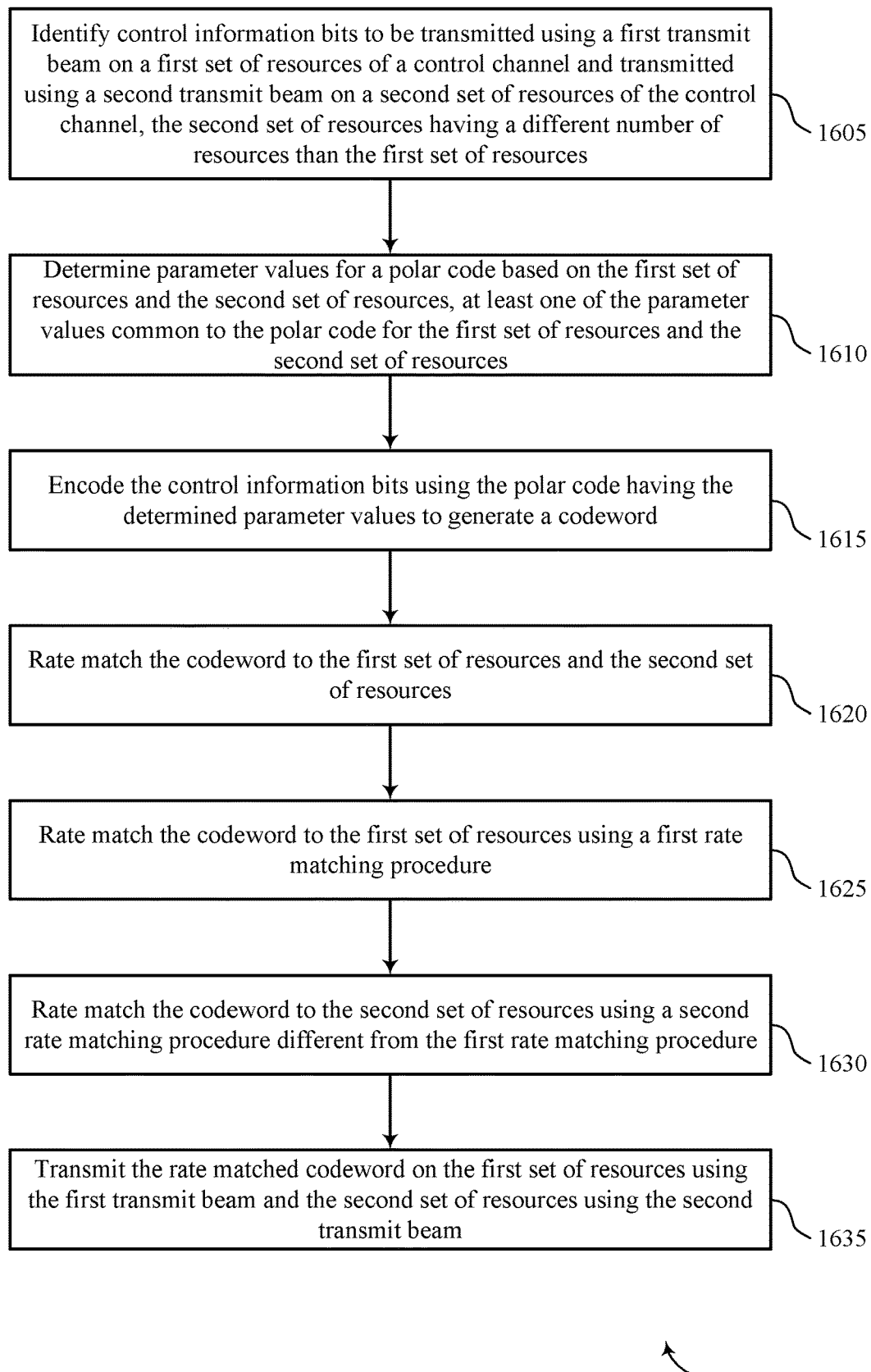

FIG. 16 shows a flowchart illustrating a method 1600 that supports control channel mother code determination for multi-TCI communication in accordance with aspects of the present disclosure. The operations of method 1600 may be implemented by an encoder or its components as described herein. For example, the operations of method 1600 may be performed by an encoder communications manager as described with reference to FIGS. 7 through 10. In some examples, an encoder may execute a set of instructions to control the functional elements of the encoder to perform the functions described below. Additionally or alternatively, an encoder may perform aspects of the functions described below using special-purpose hardware.

At 1605, the encoder may identify control information bits to be transmitted using a first transmit beam on a first set of resources of a control channel and transmitted using a second transmit beam on a second set of resources of the control channel, the second set of resources having a different number of resources than the first set of resources. The operations of 1605 may be performed according to the methods described herein. In some examples, aspects of the operations of 1605 may be performed by a control information identifier as described with reference to FIGS. 7 through 10.

At 1610, the encoder may determine parameter values for a polar code based on the first set of resources and the second set of resources, at least one of the parameter values common to the polar code for the first set of resources and the second set of resources. The operations of 1610 may be performed according to the methods described herein. In some examples, aspects of the operations of 1610 may be performed by a mother code component as described with reference to FIGS. 7 through 10.

At 1615, the encoder may encode the control information bits using the polar code having the determined parameter values to generate a codeword. The operations of 1615 may be performed according to the methods described herein. In some examples, aspects of the operations of 1615 may be performed by a polar code encoder as described with reference to FIGS. 7 through 10.

At 1620, the encoder may rate match the codeword to the first set of resources and the second set of resources. The operations of 1620 may be performed according to the methods described herein. In some examples, aspects of the operations of 1620 may be performed by a rate matching component as described with reference to FIGS. 7 through 10.

At 1625, the encoder may rate match the codeword to the first set of resources using a first rate matching procedure. The operations of 1625 may be performed according to the methods described herein. In some examples, aspects of the operations of 1625 may be performed by a rate matching component as described with reference to FIGS. 7 through 10.

At 1630, the encoder may rate match the codeword to the second set of resources using a second rate matching procedure different from the first rate matching procedure. The operations of 1630 may be performed according to the methods described herein. In some examples, aspects of the operations of 1630 may be performed by a rate matching component as described with reference to FIGS. 7 through 10.

At 1635, the encoder may transmit the rate matched codeword on the first set of resources using the first transmit beam and the second set of resources using the second transmit beam. The operations of 1635 may be performed according to the methods described herein. In some examples, aspects of the operations of 1635 may be performed by a codeword transmitter as described with reference to FIGS. 7 through 10.

Figure 17:
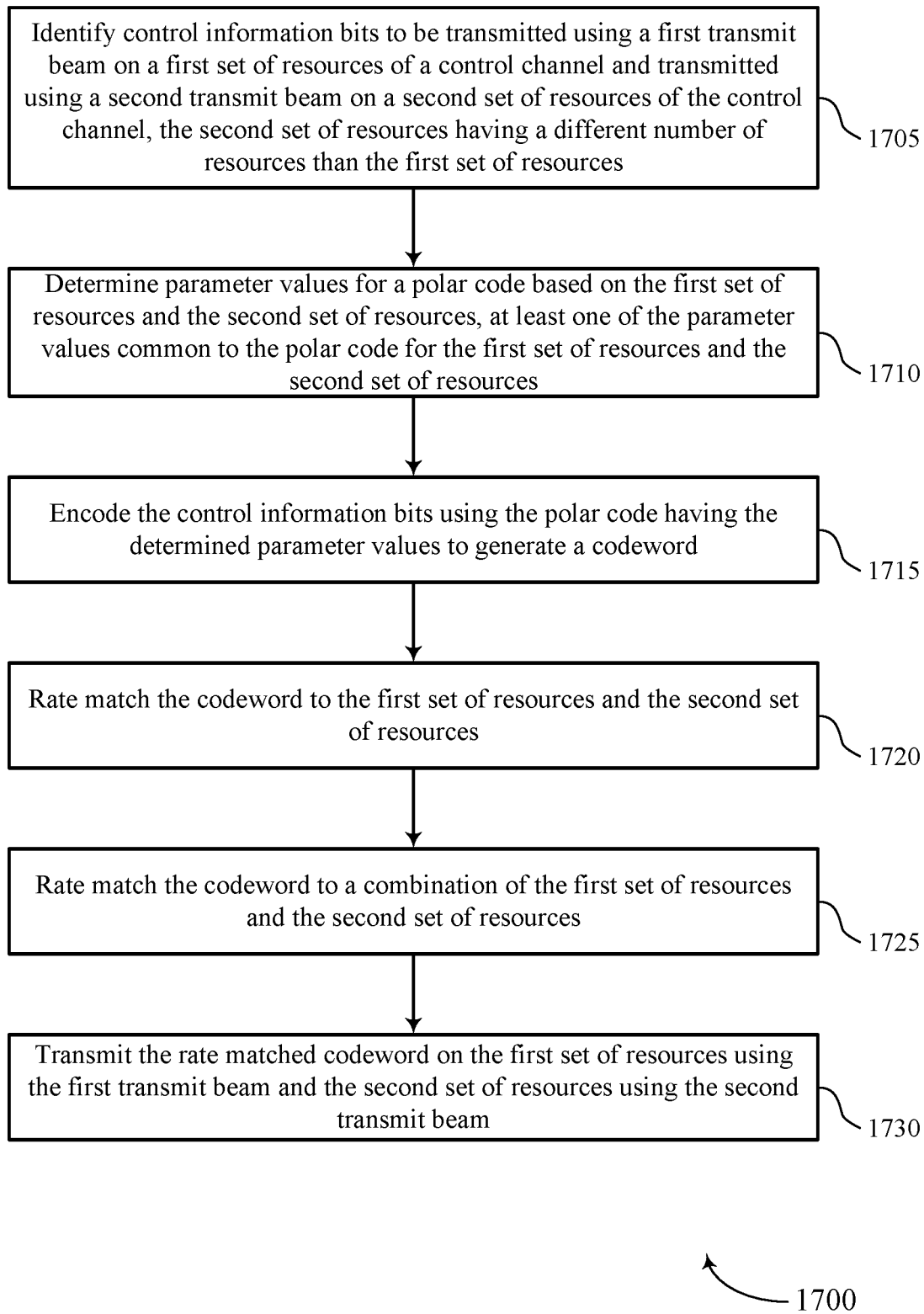

FIG. 17 shows a flowchart illustrating a method 1700 that supports control channel mother code determination for multi-TCI communication in accordance with aspects of the present disclosure. The operations of method 1700 may be implemented by an encoder or its components as described herein. For example, the operations of method 1700 may be performed by an encoder communications manager as described with reference to FIGS. 7 through 10. In some examples, an encoder may execute a set of instructions to control the functional elements of the encoder to perform the functions described below. Additionally or alternatively, an encoder may perform aspects of the functions described below using special-purpose hardware.

At 1705, the encoder may identify control information bits to be transmitted using a first transmit beam on a first set of resources of a control channel and transmitted using a second transmit beam on a second set of resources of the control channel, the second set of resources having a different number of resources than the first set of resources. The operations of 1705 may be performed according to the methods described herein. In some examples, aspects of the operations of 1705 may be performed by a control information identifier as described with reference to FIGS. 7 through 10.

At 1710, the encoder may determine parameter values for a polar code based on the first set of resources and the second set of resources, at least one of the parameter values common to the polar code for the first set of resources and the second set of resources. The operations of 1710 may be performed according to the methods described herein. In some examples, aspects of the operations of 1710 may be performed by a mother code component as described with reference to FIGS. 7 through 10.

At 1715, the encoder may encode the control information bits using the polar code having the determined parameter values to generate a codeword. The operations of 1715 may be performed according to the methods described herein. In some examples, aspects of the operations of 1715 may be performed by a polar code encoder as described with reference to FIGS. 7 through 10.

At 1720, the encoder may rate match the codeword to the first set of resources and the second set of resources. The operations of 1720 may be performed according to the methods described herein. In some examples, aspects of the operations of 1720 may be performed by a rate matching component as described with reference to FIGS. 7 through 10.

At 1725, the encoder may rate match the codeword to a combination of the first set of resources and the second set of resources. The operations of 1725 may be performed according to the methods described herein. In some examples, aspects of the operations of 1725 may be performed by a rate matching component as described with reference to FIGS. 7 through 10.

At 1730, the encoder may transmit the rate matched codeword on the first set of resources using the first transmit beam and the second set of resources using the second transmit beam. The operations of 1730 may be performed according to the methods described herein. In some examples, aspects of the operations of 1730 may be performed by a codeword transmitter as described with reference to FIGS. 7 through 10.

Figure 18:
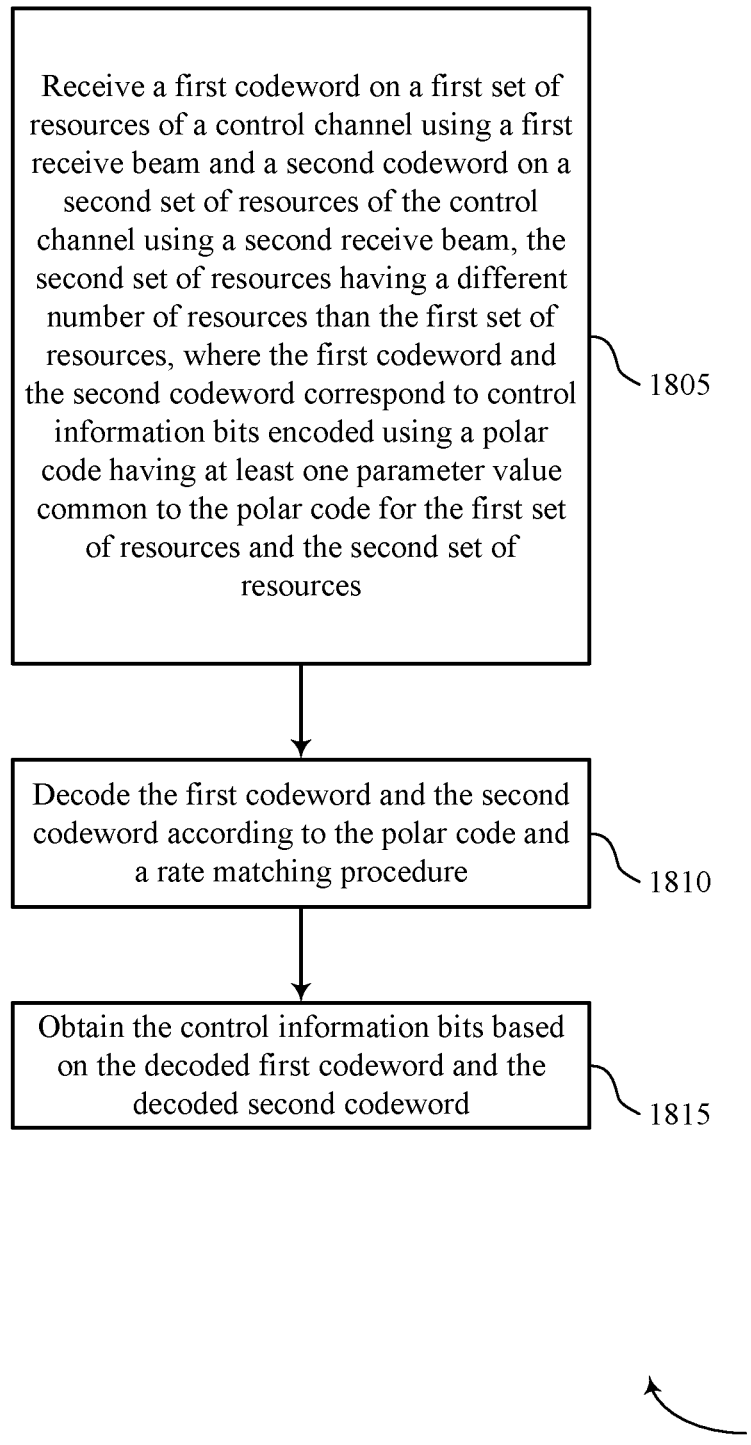

FIG. 18 shows a flowchart illustrating a method 1800 that supports control channel mother code determination for multi-TCI communication in accordance with aspects of the present disclosure. The operations of method 1800 may be implemented by a decoder or its components as described herein. For example, the operations of method 1800 may be performed by a decoder communications manager as described with reference to FIGS. 11 through 14. In some examples, a decoder may execute a set of instructions to control the functional elements of the decoder to perform the functions described below. Additionally or alternatively, a decoder may perform aspects of the functions described below using special-purpose hardware.

At 1805, the decoder may receive a first codeword on a first set of resources of a control channel using a first receive beam and a second codeword on a second set of resources of the control channel using a second receive beam, the second set of resources having a different number of resources than the first set of resources, where the first codeword and the second codeword correspond to control information bits encoded using a polar code having at least one parameter value common to the polar code for the first set of resources and the second set of resources. The operations of 1805 may be performed according to the methods described herein. In some examples, aspects of the operations of 1805 may be performed by a codeword receiver as described with reference to FIGS. 11 through 14.

At 1810, the decoder may decode the first codeword and the second codeword according to the polar code and a rate matching procedure. The operations of 1810 may be performed according to the methods described herein. In some examples, aspects of the operations of 1810 may be performed by a polar code decoding component as described with reference to FIGS. 11 through 14.

At 1815, the decoder may obtain the control information bits based on the decoded first codeword and the decoded second codeword. The operations of 1815 may be performed according to the methods described herein. In some examples, aspects of the operations of 1815 may be performed by a control information combiner as described with reference to FIGS. 11 through 14.

Figure 19:
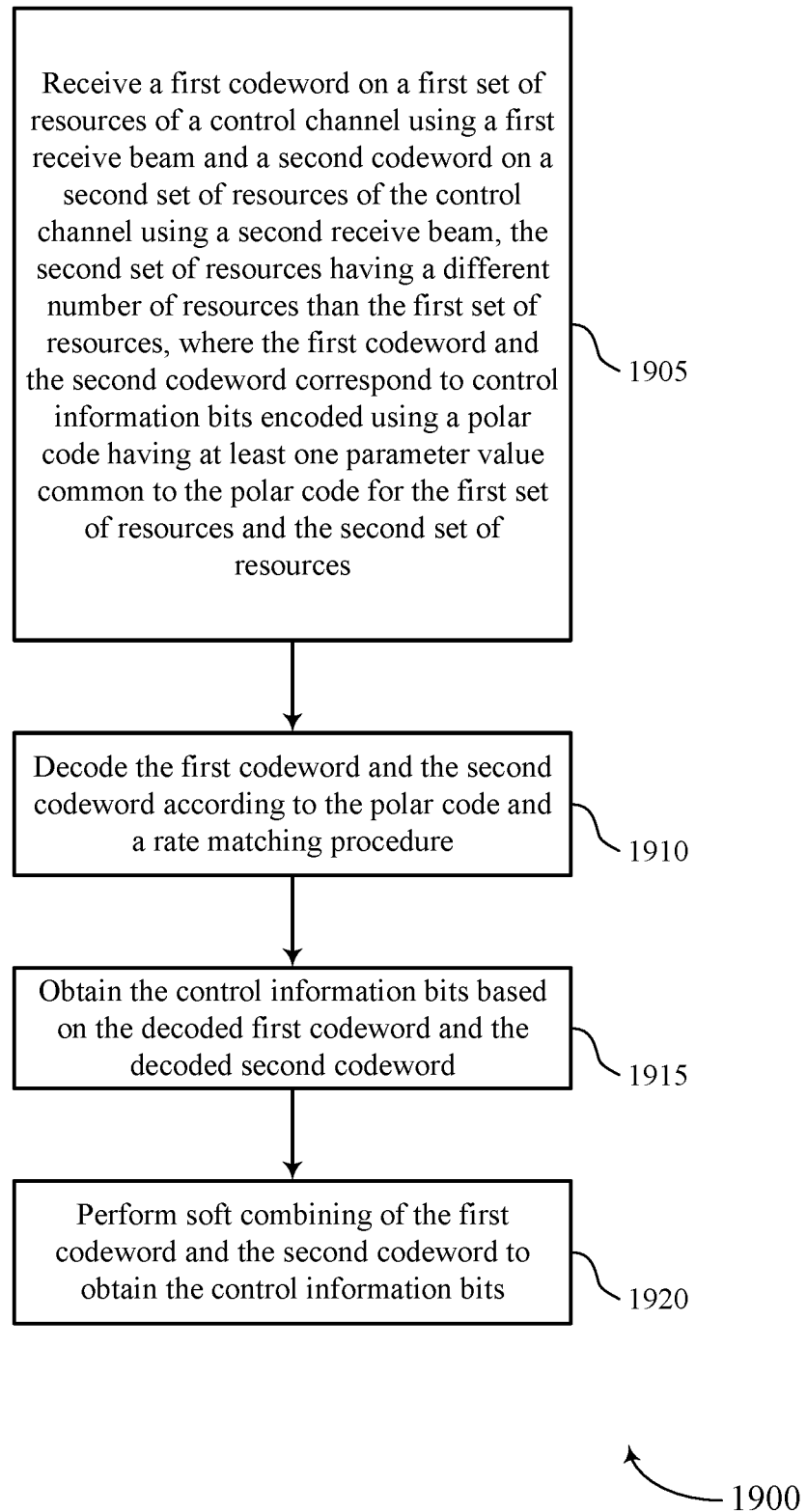

FIG. 19 shows a flowchart illustrating a method 1900 that supports control channel mother code determination for multi-TCI communication in accordance with aspects of the present disclosure. The operations of method 1900 may be implemented by a decoder or its components as described herein. For example, the operations of method 1900 may be performed by a decoder communications manager as described with reference to FIGS. 11 through 14. In some examples, a decoder may execute a set of instructions to control the functional elements of the decoder to perform the functions described below. Additionally or alternatively, a decoder may perform aspects of the functions described below using special-purpose hardware.

At 1905, the decoder may receive a first codeword on a first set of resources of a control channel using a first receive beam and a second codeword on a second set of resources of the control channel using a second receive beam, the second set of resources having a different number of resources than the first set of resources, where the first codeword and the second codeword correspond to control information bits encoded using a polar code having parameter values common to the polar code for the first set of resources and the second set of resources. The operations of 1905 may be performed according to the methods described herein. In some examples, aspects of the operations of 1905 may be performed by a codeword receiver as described with reference to FIGS. 11 through 14.

At 1910, the decoder may decode the first codeword and the second codeword according to the polar code and a rate matching procedure. The operations of 1910 may be performed according to the methods described herein. In some examples, aspects of the operations of 1910 may be performed by a polar code decoding component as described with reference to FIGS. 11 through 14.

At 1915, the decoder may obtain the control information bits based on the decoded first codeword and the decoded second codeword. The operations of 1915 may be performed according to the methods described herein. In some examples, aspects of the operations of 1915 may be performed by a control information combiner as described with reference to FIGS. 11 through 14.

At 1920, the decoder may perform soft combining of the first codeword and the second codeword to obtain the control information bits. The operations of 1920 may be performed according to the methods described herein. In some examples, aspects of the operations of 1920 may be performed by a control information combiner as described with reference to FIGS. 11 through 14.

It should be noted that the methods described above describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other PLD, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include RAM, ROM, electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

Embodiment 1: A method of wireless communication, comprising: identifying control information bits to be transmitted using a first transmit beam on a first set of resources of a control channel and to be transmitted using a second transmit beam on a second set of resources of the control channel, the second set of resources having a different number of resources than the first set of resources; determining parameter values for a polar code based at least in part on the first set of resources and the second set of resources, at least one of the parameter values common to the polar code for the first set of resources and the second set of resources; encoding the control information bits using the polar code having the determined parameter values to generate a codeword; rate matching the codeword to the first set of resources and the second set of resources; and transmitting the rate matched codeword on the first set of resources using the first transmit beam and the second set of resources using the second transmit beam.

Embodiment 2: The method of embodiment 1, wherein the at least one of the parameter values common to the polar code comprises a number of information bits of the polar code, or a block code length of the polar code, or a combination thereof.

Embodiment 3: The method of any of embodiments 1 or 2, wherein determining the parameter values for the polar code comprises: identifying a first number of available coded bits for the first set of resources; identifying a second number of available coded bits for the second set of resources; and determining the parameter values for the polar code based at least in part on the first number of available coded bits, or the second number of available coded bits, or a combination thereof, and the first set of resources and the second set of resources.

Embodiment 4: The method of any of embodiments 1 to 3, wherein determining the parameter values for the polar code comprises: identifying a rule used to determine the parameter values for the polar code; and determining the parameter values for the polar code based at least in part on the identified rule, the first set of resources, and the second set of resources.

Embodiment 5: The method of any of embodiments 1 to 4, further comprising: communicating an indication of the rule, wherein the rule is identified based at least in part on the communicated indication.

Embodiment 6: The method of embodiment 5, wherein communicating the indication of the rule comprises: communicating the indication of the rule in RRC signaling, or a DCI, or a MAC CE.

Embodiment 7: The method of any of embodiments 1 to 6, wherein rate matching the codeword to the first set of resources and the second set of resources comprises: rate matching the codeword to the first set of resources using a first rate matching procedure; and rate matching the codeword to the second set of resources using a second rate matching procedure different from the first rate matching procedure.

Embodiment 8: The method of embodiment 7, wherein the first rate matching procedure comprises puncturing, or shortening, or repetition, or a combination thereof; the second rate matching procedure comprises puncturing, or shortening, or repetition, or a combination thereof; and the second rate matching procedure is different than the first rate matching procedure.

Embodiment 9: The method of any of embodiments 1 to 6, wherein rate matching the codeword to the first set of resources and the second set of resources comprises: rate matching the codeword to a combination of the first set of resources and the second set of resources.

Embodiment 10: The method of any of embodiments 1 to 9, wherein the control channel comprises an uplink control channel, and the control information bits correspond to UCI; or the control channel comprises a downlink control channel, and the control information bits correspond to DCI.

Embodiment 11: The method of any of embodiments 1 to 10, wherein a first input vector of the polar code for the first set of resources comprises one or more frozen bits or one or more parity check bits with a same location in a second input vector of the polar code for the second set of resources.

Embodiment 12: The method of any of embodiments 1 to 11, wherein determining the parameter values for the polar code comprises: identifying a total number of resources across the first set of resources and the second set of resources; and determining the parameter values for the polar code based at least in part on the identified total number of resources.

Embodiment 13: The method of any of embodiments 1 to 12, further comprising: identifying one of the first set of resources or the second set of resources as having a higher value of a channel characteristic; and mapping higher reliability bits of the control information bits to the one of the first set of resources or the second set of resources having the higher value of the channel characteristic.

Embodiment 14: The method of embodiment 13, further comprising: identifying values of the channel characteristic for the first set of resources of the control channel, or the second set of resources of the control channel, or a combination thereof, based at least in part on QCL information, wherein the channel characteristic comprises an SNR, or an SINK, or a signal strength, or a signal quality, or a combination thereof.

Embodiment 15: The method of any of embodiments 1 to 14, further comprising: identifying that a first codeblock for the control channel has a lower priority than a second codeblock to be mapped to the second set of resources for the control channel; and mapping the first codeblock to a subset of the first set of resources based at least in part on the lower priority.

Embodiment 16: The method of any of embodiments 1 to 15, wherein: the at least one of the parameter values common to the polar code for the first set of resources and the second set of resources is associated with a first parameter for the polar code; and a first parameter value for a second parameter for the polar code for the first set of resources is different than a second parameter value for the second parameter for the second set of resources.

Embodiment 17: An apparatus comprising at least one means for performing a method of any embodiments 1 to 16.

Embodiment 18: An apparatus for wireless communications comprising a processor; memory in electronic communication with the processor; and instructions stored in the memory and executable by the processor to cause the apparatus to perform a method of any embodiments 1 to 16.

Embodiment 19: A non-transitory computer-readable medium storing code for wireless communications, the code comprising instructions executable by a processor to perform a method of any embodiments 1 to 16.

Embodiment 20: A method of wireless communication, comprising: receiving a first codeword on a first set of resources of a control channel using a first receive beam and a second codeword on a second set of resources of the control channel using a second receive beam, the second set of resources having a different number of resources than the first set of resources, wherein the first codeword and the second codeword correspond to control information bits encoded using a polar code having at least one parameter value common to the polar code for the first set of resources and the second set of resources; decoding the first codeword and the second codeword according to the polar code and a rate matching procedure; and obtaining the control information bits based at least in part on the decoded first codeword and the decoded second codeword.

Embodiment 21: The method of embodiment 20, further comprising: performing soft combining of the first codeword and the second codeword to obtain the control information bits.

Embodiment 22: The method of any of embodiments 20 or 21, wherein the at least one parameter value common to the polar code comprises a number of information bits of the polar code, or a block code length of the polar code, or a combination thereof.

Embodiment 23: The method of any of embodiments 20 to 22, further comprising: identifying a first number of available coded bits for the first set of resources; identifying a second number of available coded bits for the second set of resources; and determining the at least one parameter value common to the polar code based at least in part on the first number of available coded bits, or the second number of available coded bits, or a combination thereof.

Embodiment 24: The method of any of embodiments 20 to 23, further comprising: identifying a rule used to determine the at least one parameter value common to the polar code; and determining the at least one parameter value based at least in part on the identified rule, the first set of resources, and the second set of resources.

Embodiment 25: The method of any of embodiments 20 to 24, further comprising: communicating an indication of the rule, wherein the rule is identified based at least in part on the communicated indication.

Embodiment 26: The method of embodiment 25, wherein communicating the indication comprises: communicating the indication in RRC control, or a DCI, or a MAC CE.

Embodiment 27: The method of any of embodiments 20 to 26, wherein decoding the first codeword and the second codeword according to the polar code and the rate matching procedure comprises: decoding the first codeword according to the polar code and a first rate matching procedure; and decoding the second codeword according to the polar code and a second rate matching procedure, the second rate matching procedure different from the first rate matching procedure.

Embodiment 28: The method of any of embodiments 20 to 27, wherein decoding the first codeword and the second codeword according to the polar code and the rate matching procedure comprises: decoding the first codeword and the second codeword according to the polar code and the rate matching procedure for a combination of the first set of resources and the second set of resources.

Embodiment 29: The method of any of embodiments 20 to 28, wherein the control channel comprises an uplink control channel, and the control information bits correspond to UCI; or the control channel comprises a downlink control channel, and the control information bits correspond to DCI.

Embodiment 30: The method of any of embodiments 20 to 29, further comprising: identifying a total number of resources across the first set of resources and the second set of resources; and determining the at least one parameter value common to the polar code based at least in part on the identified total number of resources.

Embodiment 31: An apparatus comprising at least one means for performing a method of any embodiments 20 to 30.

Embodiment 32: An apparatus for wireless communications comprising a processor; memory in electronic communication with the processor; and instructions stored in the memory and executable by the processor to cause the apparatus to perform a method of any embodiments 20 to 30.

Embodiment 33: A non-transitory computer-readable medium storing code for wireless communications, the code comprising instructions executable by a processor to perform a method of any embodiments 20 to 30.

What is claimed is:

1. A method for wireless communication, comprising:
identifying control information bits to be transmitted using a first transmit beam on a first set of resources of a control channel and to be transmitted using a second transmit beam on a second set of resources of the control channel, the second set of resources of the control channel having a different number of resources than the first set of resources of the control channel;
determining parameter values for a polar code based at least in part on the first set of resources of the control channel and the second set of resources of the control channel, at least one of the parameter values common to the polar code for the first set of resources of the control channel and the second set of resources of the control channel;

encoding the control information bits using the polar code having the determined parameter values to generate a codeword;

rate matching the codeword to the first set of resources of the control channel and the second set of resources of the control channel; and transmitting the rate matched codeword on the first set of resources of the control channel using the first transmit beam and the second set of resources of the control channel using the second transmit beam.

2. The method of claim 1, wherein the at least one of the parameter values common to the polar code comprises a number of information bits of the polar code, or a block code length of the polar code, or a combination thereof.

3. The method of claim 1, wherein determining the parameter values for the polar code comprises:
identifying a first number of available coded bits for the first set of resources of the control channel;
identifying a second number of available coded bits for the second set of resources of the control channel; and
determining the parameter values for the polar code based at least in part on the first number of available coded bits, or the second number of available coded bits, or a combination thereof, and the first set of resources of the control channel and the second set of resources of the control channel.

4. The method of claim 1, wherein determining the parameter values for the polar code comprises:
identifying a rule used to determine the parameter values for the polar code; and
determining the parameter values for the polar code based at least in part on the identified rule, the first set of resources of the control channel, and the second set of resources of the control channel.

5. The method of claim 4, further comprising:
communicating an indication of the rule, wherein the rule is identified based at least in part on the communicated indication.

6. The method of claim 5, wherein communicating the indication of the rule comprises:
communicating the indication of the rule in radio resource control (RRC) signaling, or a downlink control information (DCI), or a medium access control (MAC) control element (CE).

7. The method of claim 1, wherein rate matching the codeword to the first set of resources of the control channel and the second set of resources of the control channel comprises:
rate matching the codeword to the first set of resources of the control channel using a first rate matching procedure; and
rate matching the codeword to the second set of resources of the control channel using a second rate matching procedure different from the first rate matching procedure.

8. The method of claim 7, wherein:
the first rate matching procedure comprises puncturing, or shortening, or repetition, or a combination thereof;
the second rate matching procedure comprises puncturing, or shortening, or repetition, or a combination thereof; and the second rate matching procedure is different than the first rate matching procedure.

9. The method of claim 1, wherein rate matching the codeword to the first set of resources of the control channel and the second set of resources of the control channel comprises:
rate matching the codeword to a combination of the first set of resources of the control channel and the second set of resources of the control channel.

10. The method of claim 1, wherein:
the control channel comprises an uplink control channel, and the control information bits correspond to uplink control information; or
the control channel comprises a downlink control channel, and the control information bits correspond to downlink control information.

11. The method of claim 1, wherein a first input vector of the polar code for the first set of resources of the control channel comprises one or more frozen bits or one or more parity check bits with a same location in a second input vector of the polar code for the second set of resources of the control channel.

12. The method of claim 1, wherein determining the parameter values for the polar code comprises:
identifying a total number of resources across the first set of resources of the control channel and the second set of resources of the control channel; and
determining the parameter values for the polar code based at least in part on the identified total number of resources.

13. The method of claim 1, further comprising:
identifying one of the first set of resources of the control channel or the second set of resources of the control channel as having a higher value of a channel characteristic; and
mapping higher reliability bits of the control information bits to the one of the first set of resources of the control channel or the second set of resources of the control channel having the higher value of the channel characteristic.

14. The method of claim 13, further comprising:
identifying values of the channel characteristic for the first set of resources of the control channel, or the second set of resources of the control channel, or a combination thereof, based at least in part on quasi-co-location information, wherein the channel characteristic comprises a signal-to-noise ratio (SNR), or a signal-to-interference-plus-noise ratio (SINR), or a signal strength, or a signal quality, or a combination thereof.

15. The method of claim 1, further comprising:
identifying that a first codeblock for the control channel has a lower priority than a second codeblock for the control channel to be mapped to the second set of resources of the control channel; and
mapping the first codeblock to a subset of the first set of resources of the control channel based at least in part on the lower priority.

16. The method of claim 1, wherein:
the at least one of the parameter values common to the polar code for the first set of resources of the control channel and the second set of resources of the control channel is associated with a first parameter for the polar code; and
a first parameter value for a second parameter for the polar code for the first set of resources of the control channel is different than a second parameter value for the second parameter for the second set of resources of the control channel.

17. A method for wireless communication, comprising:
receiving a first codeword on a first set of resources of a control channel using a first receive beam and a second codeword on a second set of resources of the control channel using a second receive beam, the second set of resources of the control channel having a different number of resources than the first set of resources of the control channel, wherein the first codeword and the second codeword correspond to control information bits encoded using a polar code having at least one parameter value common to the polar code for the first set of resources of the control channel and the second set of resources of the control channel;
decoding the first codeword and the second codeword according to the polar code and a rate matching procedure; and
obtaining the control information bits based at least in part on the decoded first codeword and the decoded second codeword.

18. The method of claim 17, further comprising:
performing soft combining of the first codeword and the second codeword to obtain the control information bits.

19. The method of claim 17, wherein the at least one parameter value common to the polar code comprises a number of information bits of the polar code, or a block code length of the polar code, or a combination thereof.

20. The method of claim 17, further comprising:
identifying a first number of available coded bits for the first set of resources of the control channel;
identifying a second number of available coded bits for the second set of resources of the control channel; and
determining the at least one parameter value common to the polar code based at least in part on the first number of available coded bits, or the second number of available coded bits, or a combination thereof.

21. The method of claim 17, further comprising:
identifying a rule used to determine the at least one parameter value common to the polar code; and
determining the at least one parameter value based at least in part on the identified rule, the first set of resources of the control channel, and the second set of resources of the control channel.

22. The method of claim 17, further comprising:
communicating an indication of the rule, wherein the rule is identified based at least in part on the communicated indication.

23. The method of claim 22, wherein communicating the indication comprises:
communicating the indication in radio resource control (RRC) control, or a downlink control information (DCI), or a medium access control (MAC) control element (CE).

24. The method of claim 17, wherein decoding the first codeword and the second codeword according to the polar code and the rate matching procedure comprises:
decoding the first codeword according to the polar code and a first rate matching procedure; and
decoding the second codeword according to the polar code and a second rate matching procedure, the second rate matching procedure different from the first rate matching procedure.

25. The method of claim 17, wherein decoding the first codeword and the second codeword according to the polar code and the rate matching procedure comprises:
decoding the first codeword and the second codeword according to the polar code and the rate matching procedure for a combination of the first set of resources of the control channel and the second set of resources of the control channel.

26. The method of claim 17, wherein:
the control channel comprises an uplink control channel, and the control information bits correspond to uplink control information; or
the control channel comprises a downlink control channel, and the control information bits correspond to downlink control information.

27. The method of claim 17, further comprising:
identifying a total number of resources across the first set of resources of the control channel and the second set of resources of the control channel; and
determining the at least one parameter value common to the polar code based at least in part on the identified total number of resources.

28. An apparatus for wireless communication, comprising:
a processor,
memory in electronic communication with the processor; and
instructions stored in the memory and executable by the processor to cause the apparatus to:
identify control information bits to be transmitted using a first transmit beam on a first set of resources of a control channel and transmitted using a second transmit beam on a second set of resources of the control channel, the second set of resources of the control channel having a different number of resources than the first set of resources of the control channel;
determine parameter values for a polar code based at least in part on the first set of resources of the control channel and the second set of resources of the control channel, at least one of the parameter values common to the polar code for the first set of resources of the control channel and the second set of resources of the control channel;
encode the control information bits using the polar code having the determined parameter values to generate a codeword;
rate match the codeword to the first set of resources of the control channel and the second set of resources of the control channel; and
transmit the rate matched codeword on the first set of resources of the control channel using the first transmit beam and the second set of resources of the control channel using the second transmit beam.

29. The apparatus of claim 28, wherein the at least one of the parameter values common to the polar code comprises a number of information bits of the polar code, or a block code length of the polar code, or a combination thereof.

30. An apparatus for wireless communication, comprising:
a processor,
memory in electronic communication with the processor; and
instructions stored in the memory and executable by the processor to cause the apparatus to:
receive a first codeword on a first set of resources of a control channel using a first receive beam and a second codeword on a second set of resources of the control channel using a second receive beam, the second set of resources of the control channel having a different number of resources than the first set of resources of the control channel, wherein the first codeword and the second codeword correspond to control information bits encoded using a polar code having at least one parameter value common to the polar code for the first set of resources of the control channel and the second set of resources of the control channel;

decode the first codeword and the second codeword according to the polar code and a rate matching procedure; and obtain the control information bits based at least in part on the decoded first codeword and the decoded second codeword.

\* \* \* \* \*